(12) United States Patent
Masuoka et al.

(10) Patent No.: US 9,960,277 B2
(45) Date of Patent: May 1, 2018

(54) METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/824,017

(22) Filed: Nov. 28, 2017

(65) Prior Publication Data

US 2018/0090623 A1    Mar. 29, 2018

Related U.S. Application Data

(60) Division of application No. 15/191,711, filed on Jun. 24, 2016, now Pat. No. 9,865,741, which is a
(Continued)

(51) Int. Cl.
*H01L 21/00* (2006.01)
*H01L 29/786* (2006.01)
(Continued)

(52) U.S. Cl.
CPC .......... *H01L 29/78642* (2013.01); *H01L 21/823487* (2013.01); *H01L 29/42392* (2013.01);
(Continued)

(58) Field of Classification Search
CPC ......... H01L 29/78642; H01L 29/42392; H01L 29/78618; H01L 29/66666
See application file for complete search history.

(56) References Cited

U.S. PATENT DOCUMENTS 5,258,635 A    11/1993   Nitayama et al.
8,026,141 B2 *  9/2011   Masuoka ............... H01L 22/26
                                                        438/268
(Continued)

FOREIGN PATENT DOCUMENTS

JP    02071556 A    3/1990
JP    02188966 A    7/1990
(Continued)

OTHER PUBLICATIONS

C.C. Wu et al., "High Performance 22/20nm FinFET SMOS Devices with Advanced High-K/Metal Gate Scheme", 2010 IEEE International Electron Devices Meeting (IEDM), 2010, pp. 27.1.1-27.1.4, San Francisco, CA.
(Continued)

*Primary Examiner* — Laura Menz
(74) *Attorney, Agent, or Firm* — Brinks Gilson & Lione

(57) ABSTRACT

A method for producing a semiconductor device includes a first step of forming a first insulating film around a fin-shaped semiconductor layer on a semiconductor substrate; a second step of forming a second insulating film, depositing a first polysilicon, planarizing the first polysilicon, forming a third insulating film, forming a second resist, and forming a pillar-shaped semiconductor layer, a first dummy gate, and a first hard mask; and a third step of forming a fourth insulating film, depositing a second polysilicon, planarizing the second polysilicon, etching back the second polysilicon, depositing a sixth insulating film, forming a fourth resist, forming a second hard mask, forming a third hard mask, forming a second dummy gate, and forming a first dummy contact on the fin-shaped semiconductor layer.

5 Claims, 46 Drawing Sheets

Related U.S. Application Data continuation of application No. PCT/JP2014/055667, filed on Mar. 5, 2014.

(51) Int. Cl.
*H01L 29/66* (2006.01)
*H01L 21/8234* (2006.01)
*H01L 29/423* (2006.01)

(52) U.S. Cl.
CPC .. *H01L 29/66545* (2013.01); *H01L 29/66666* (2013.01); *H01L 29/78618* (2013.01); *H01L 29/78696* (2013.01)

(56) References Cited

U.S. PATENT DOCUMENTS

| | | | | |
|---|---|---|---|---|
| 8,080,458 | B2* | 12/2011 | Masuoka | H01L 29/42356 257/E21.41 |
| 8,212,311 | B2* | 7/2012 | Masuoka | H01L 21/823828 257/329 |
| 8,372,713 | B2* | 2/2013 | Masuoka | H01L 27/0207 257/329 |
| 8,497,548 | B2* | 7/2013 | Masuoka | H01L 21/823885 257/329 |
| 8,563,379 | B2 | 10/2013 | Masuoka et al. | |
| 8,647,947 | B2 | 2/2014 | Masuoka et al. | |
| 8,901,640 | B2* | 12/2014 | Masuoka | H01L 21/823431 257/328 |
| 9,583,630 | B2* | 2/2017 | Masuoka | H01L 29/78 |
| 9,640,628 | B2* | 5/2017 | Masuoka | H01L 29/4966 |
| 9,646,991 | B2* | 5/2017 | Masuoka | H01L 29/66666 |
| 9,716,092 | B2* | 7/2017 | Masuoka | H01L 27/092 |
| 9,748,244 | B2* | 8/2017 | Masuoka | H01L 27/0924 |
| 9,755,053 | B2* | 9/2017 | Masuoka | H01L 29/66666 |
| 9,812,547 | B2* | 11/2017 | Masuoka | H01L 29/4966 |
| 9,865,741 | B2* | 1/2018 | Masuoka | H01L 29/78642 |
| 9,893,179 | B2* | 2/2018 | Masuoka | H01L 29/7827 |
| 2009/0065860 | A1 | 3/2009 | Mikasa | |
| 2010/0087017 | A1* | 4/2010 | Masuoka | H01L 22/26 438/9 |
| 2010/0207201 | A1* | 8/2010 | Masuoka | H01L 27/0207 257/329 |
| 2010/0210096 | A1* | 8/2010 | Masuoka | H01L 21/823885 438/585 |
| 2010/0213525 | A1* | 8/2010 | Masuoka | H01L 21/823828 257/306 |
| 2010/0213539 | A1* | 8/2010 | Masuoka | H01L 21/84 257/329 |
| 2011/0042740 | A1* | 2/2011 | Masuoka | H01L 21/76804 257/329 |
| 2015/0255598 | A1* | 9/2015 | Masuoka | H01L 29/4238 257/329 |
| 2016/0005764 | A1* | 1/2016 | Masuoka | H01L 27/092 257/329 |
| 2016/0056174 | A1* | 2/2016 | Masuoka | H01L 29/66666 257/203 |
| 2016/0056279 | A1* | 2/2016 | Masuoka | H01L 29/66477 257/386 |
| 2016/0247892 | A1* | 8/2016 | Masuoka | H01L 21/823487 |
| 2016/0247938 | A1* | 8/2016 | Masuoka | H01L 29/7827 |
| 2016/0308046 | A1* | 10/2016 | Masuoka | H01L 29/66545 |
| 2016/0308065 | A1* | 10/2016 | Masuoka | H01L 21/823487 |
| 2016/0329899 | A1* | 11/2016 | Masuoka | H01L 27/0207 |
| 2016/0336330 | A1* | 11/2016 | Masuoka | H01L 27/115 |
| 2016/0343871 | A1* | 11/2016 | Masuoka | H01L 29/78 |
| 2017/0194453 | A1* | 7/2017 | Masuoka | H01L 29/4966 |
| 2017/0194460 | A1* | 7/2017 | Masuoka | H01L 29/66666 |
| 2017/0317204 | A1* | 11/2017 | Masuoka | H01L 29/785 |

FOREIGN PATENT DOCUMENTS

| | | | |
|---|---|---|---|
| JP | 03145761 A | 6/1991 | |
| JP | 2009-070975 A | 4/2009 | |
| JP | 2009-182317 A | 8/2009 | |
| JP | 2011-040682 A | 2/2011 | |
| JP | 2013-239622 A | 11/2013 | |
| JP | 5838530 B1 * | 1/2016 | ..... H01L 21/823487 |
| WO | WO 2014/024266 A1 | 2/2014 | |
| WO | WO 2015125204 A1 * | 8/2015 | ......... H01L 29/7827 |
| WO | WO 2015/132912 A1 | 9/2015 | |
| WO | WO 2015132912 A1 * | 9/2015 | ..... H01L 21/823487 |

OTHER PUBLICATIONS

K. Mistry, et al., "A 45nm Logic Technology with High-k+Metal Gate Transistors, Strained Silicon, 9 Cu Interconnect Layers, 193nm Dry Patterning, and 100% Pb-free Packaging", 2007 IEEE International Electron Devices Meeting, 2007, pp. 247-250, Washington, DC, URL: ftp://download.intel.com/pressroom/kits/advancedtech/pdfs/Mistry_EDM_2007_HI_K-MG_paper.pdf.

English language translation of International Preliminary Report on Patentability in corresponding International Application No. PCT/JP2014/055667, dated Sep. 15, 2016, 7 pages.

Office Action in corresponding U.S. Appl. No. 15/191,711, dated Mar. 14, 2017, 13 pages.

Office Action in corresponding U.S. Appl. No. 15/191,711, dated Jul. 12, 2017, 13 pages.

Notice of Allowance in corresponding U.S. Appl. No. 15/191,711, dated Oct. 25, 2017, 9 pages.

* cited by examiner

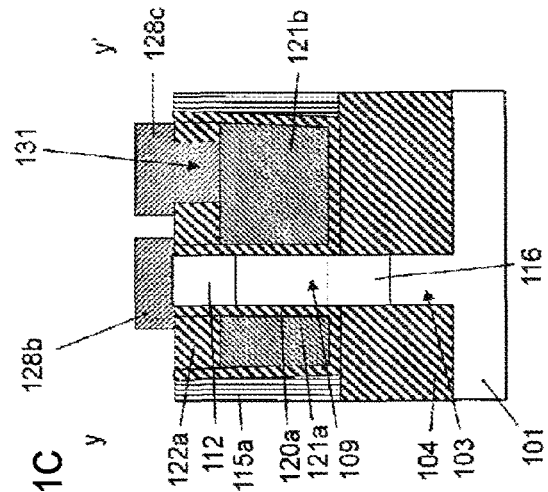
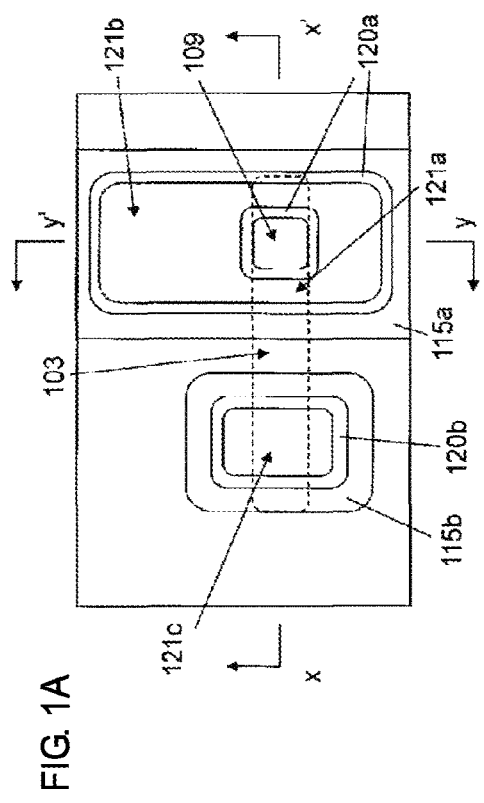
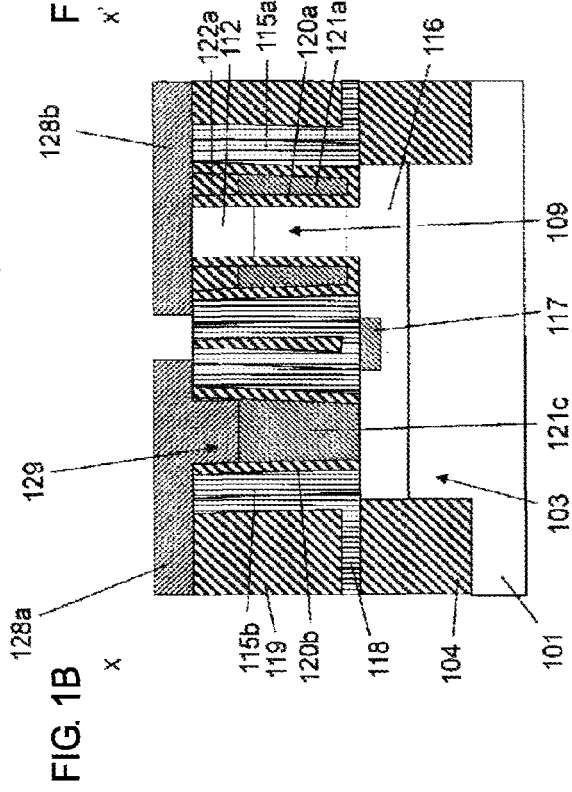

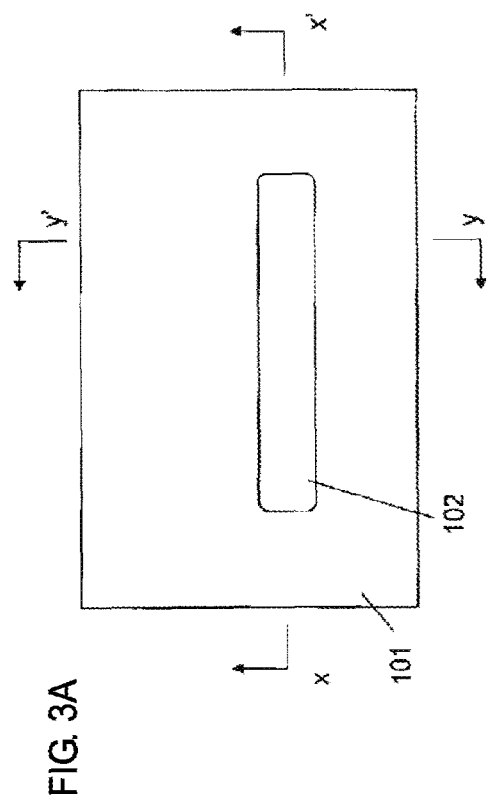
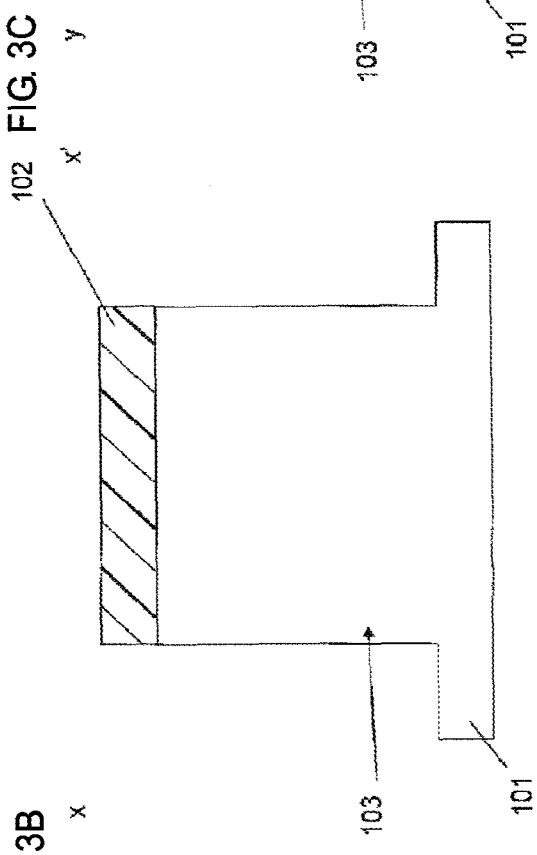
FIG. 3A
FIG. 3B
FIG. 3C

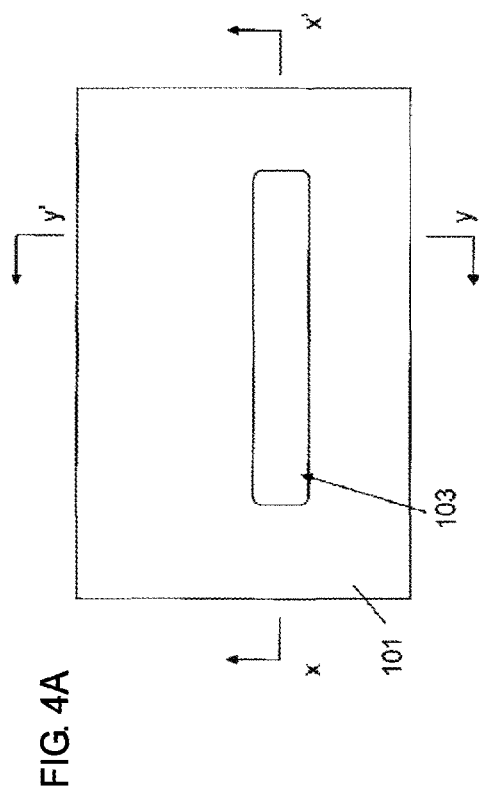
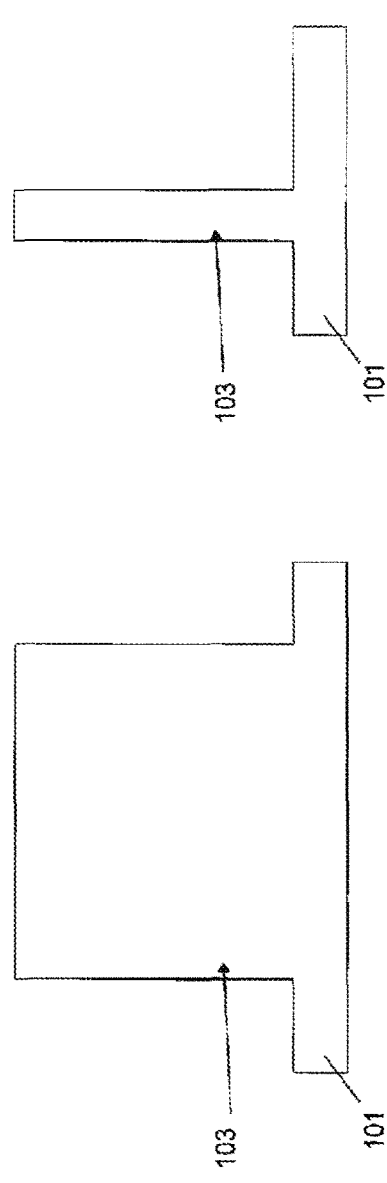
FIG. 4A
FIG. 4B
FIG. 4C

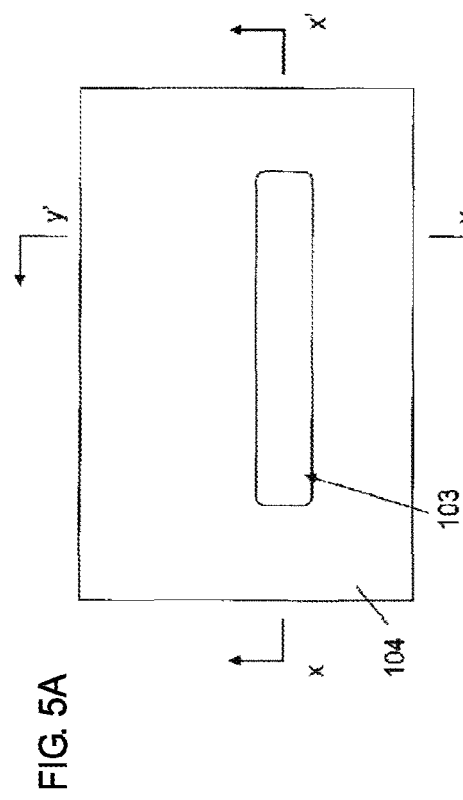
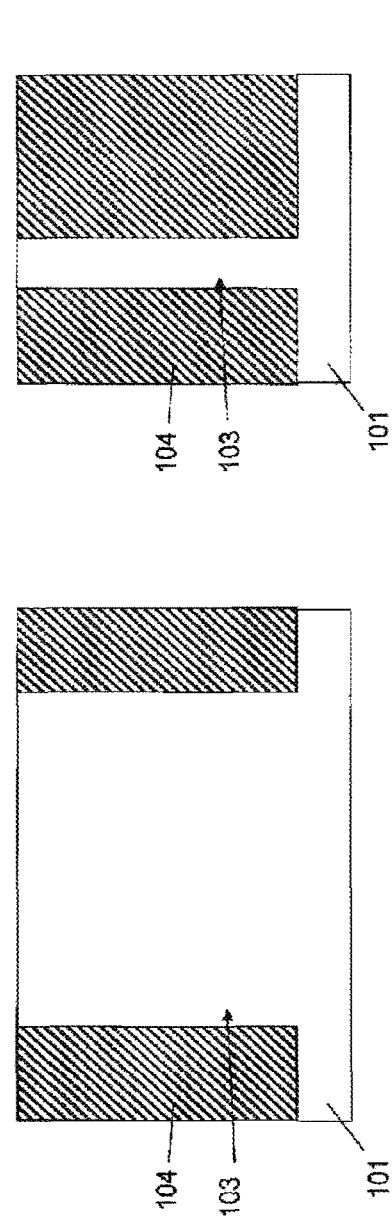

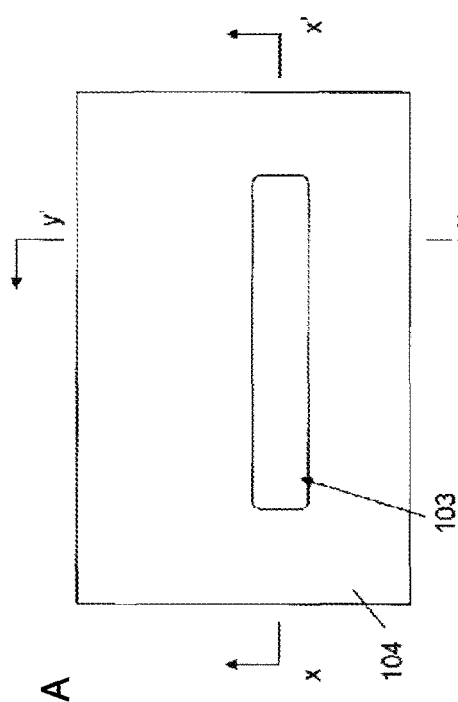
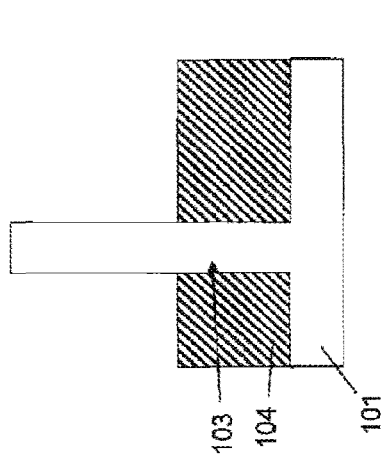
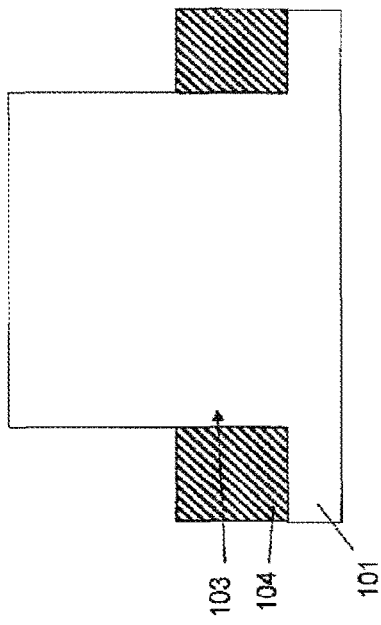
FIG. 6A
FIG. 6B
FIG. 6C

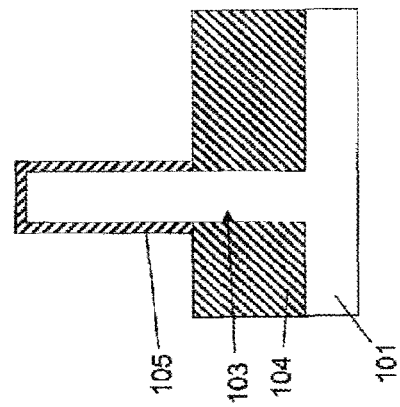
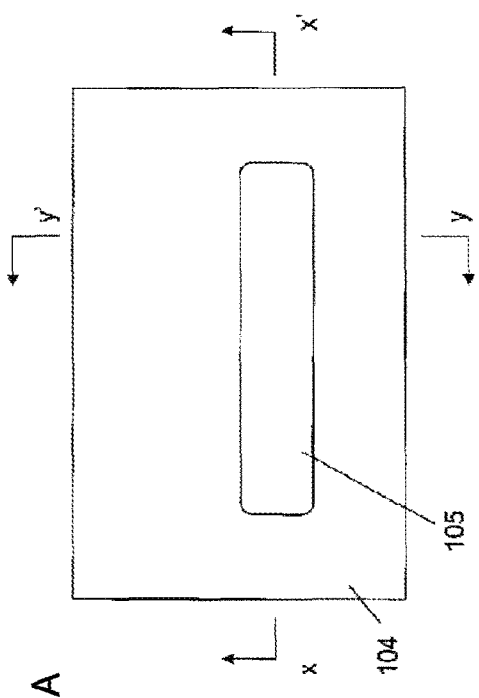
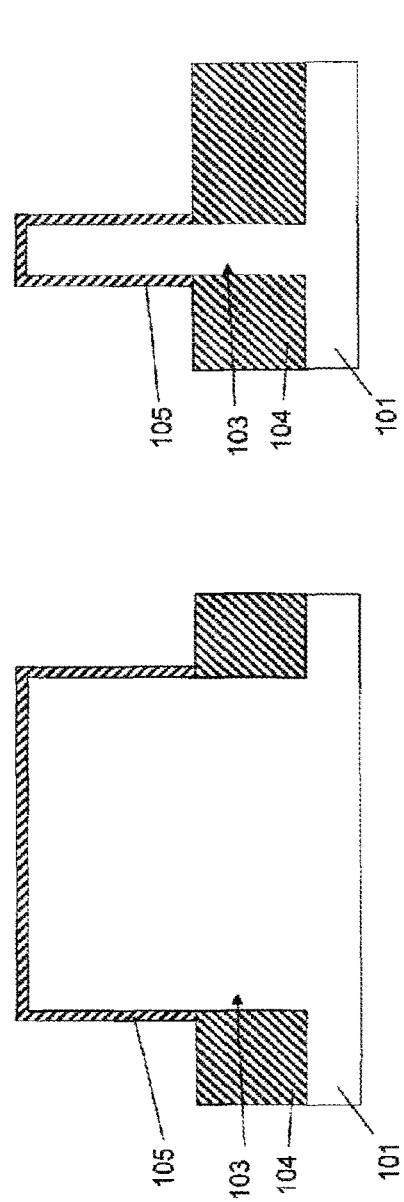

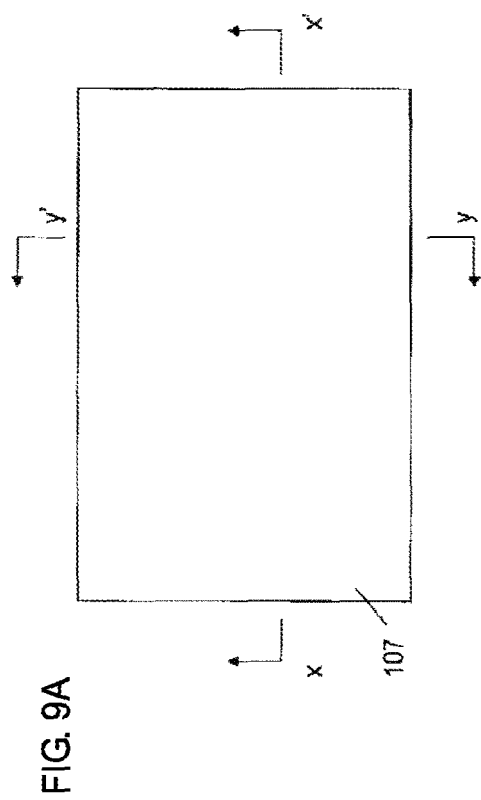
FIG. 9A
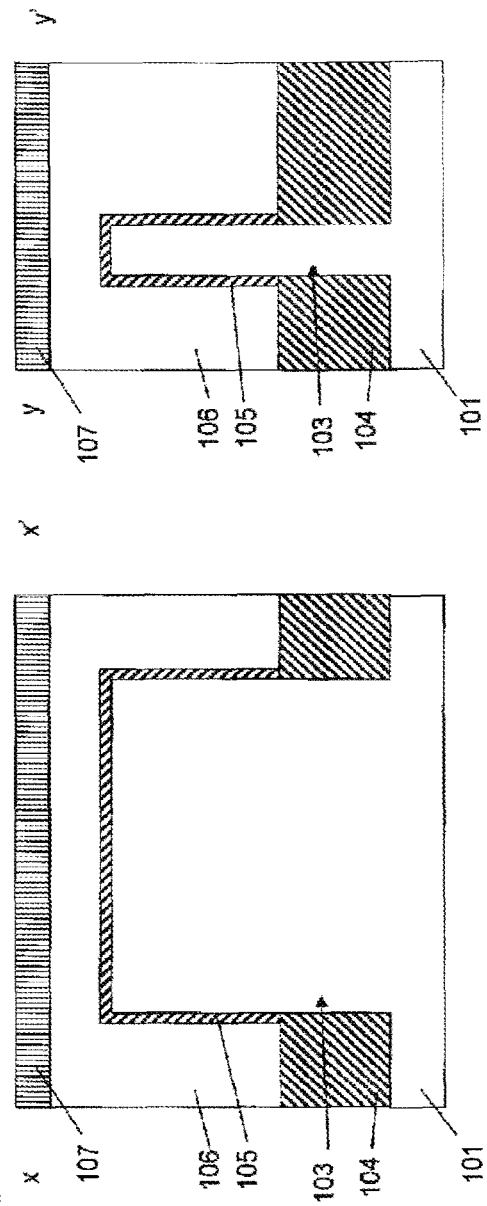
FIG. 9B
FIG. 9C

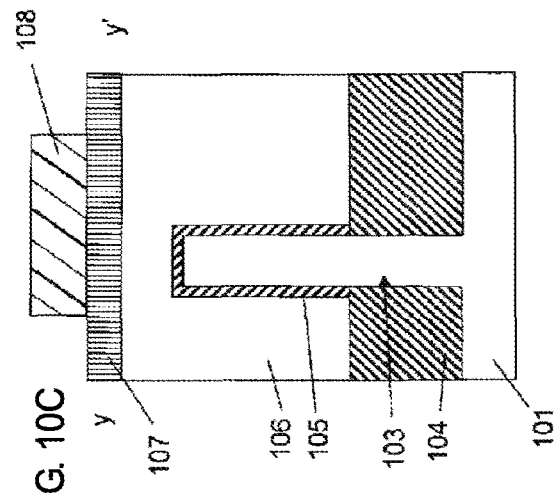
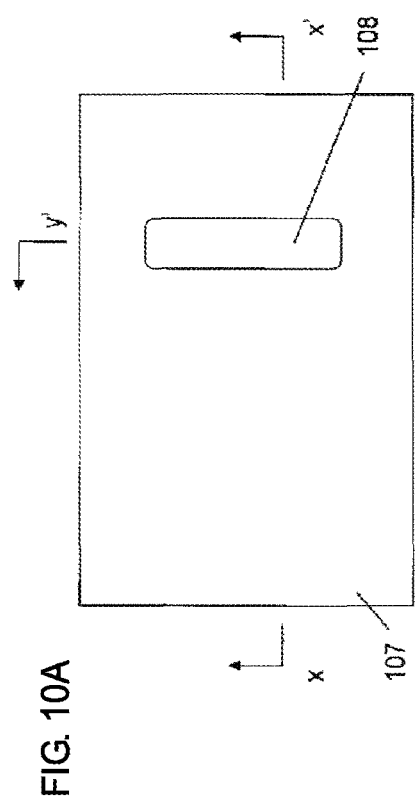
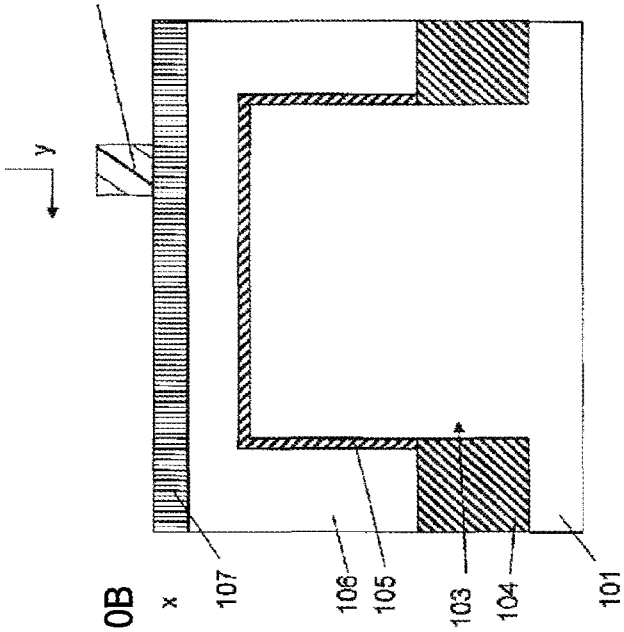

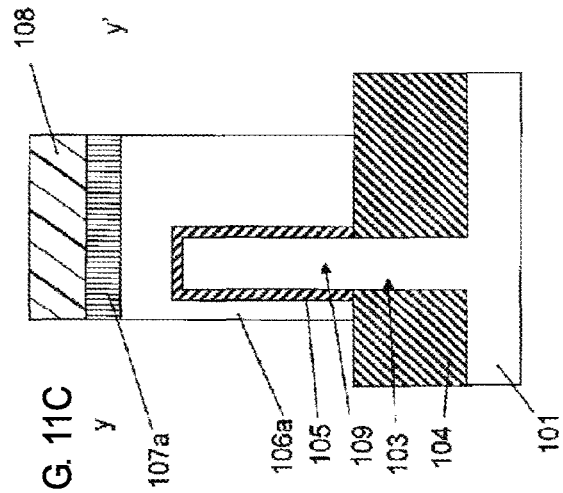
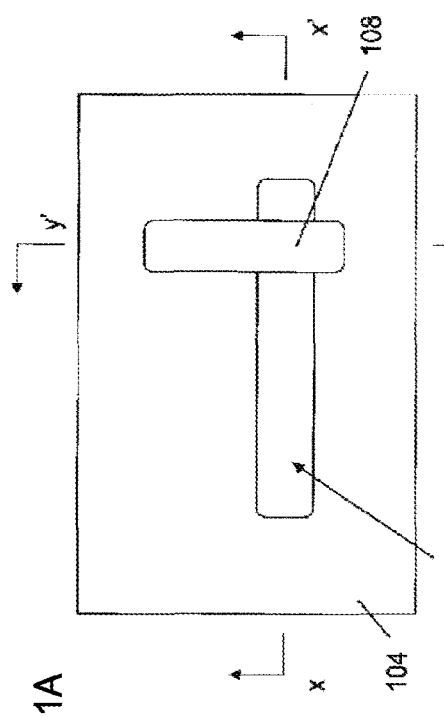
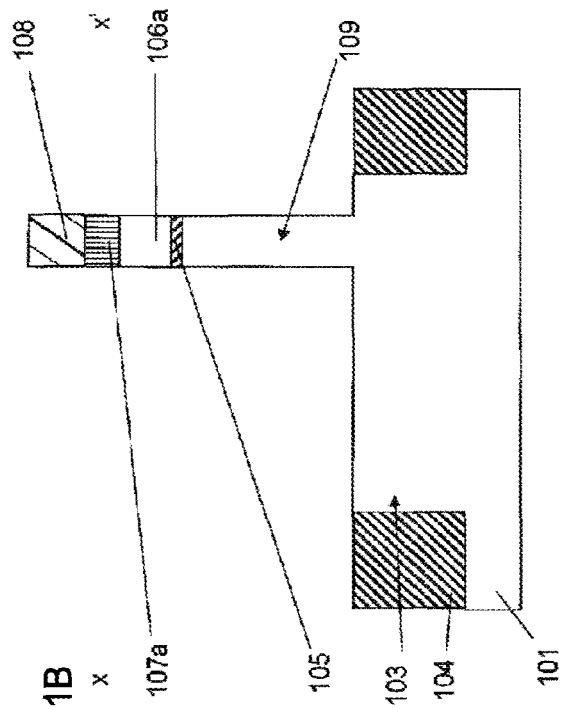

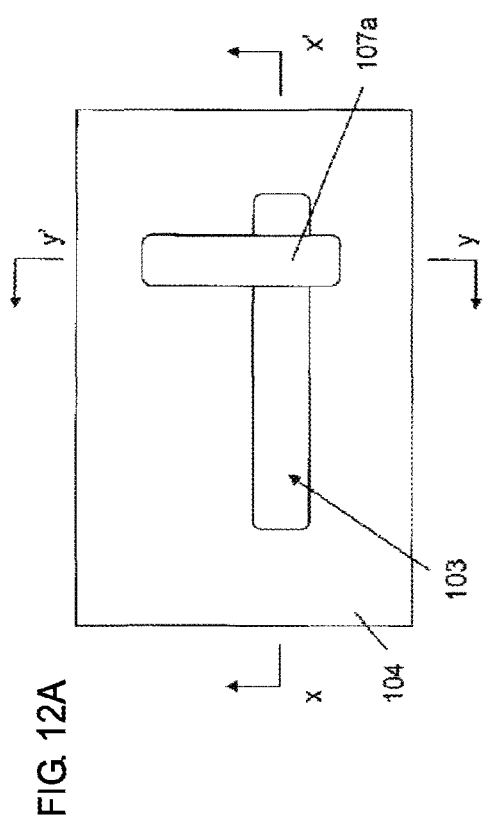
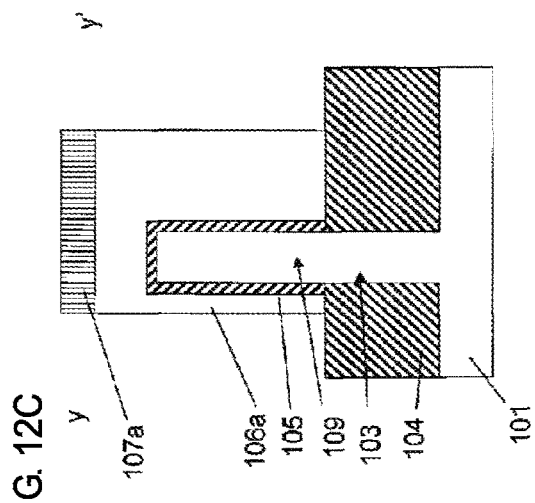
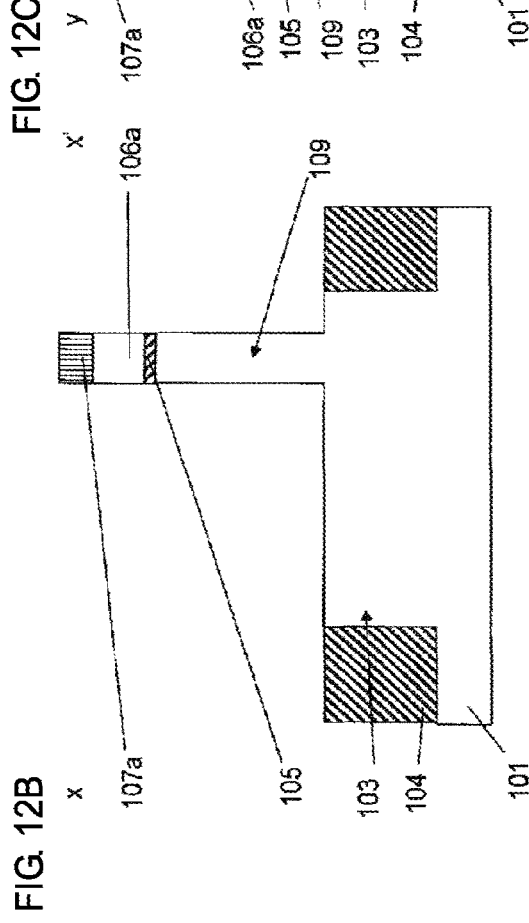

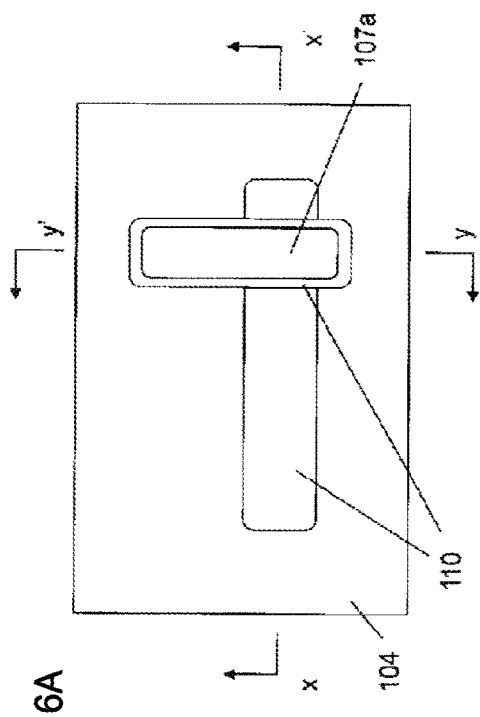
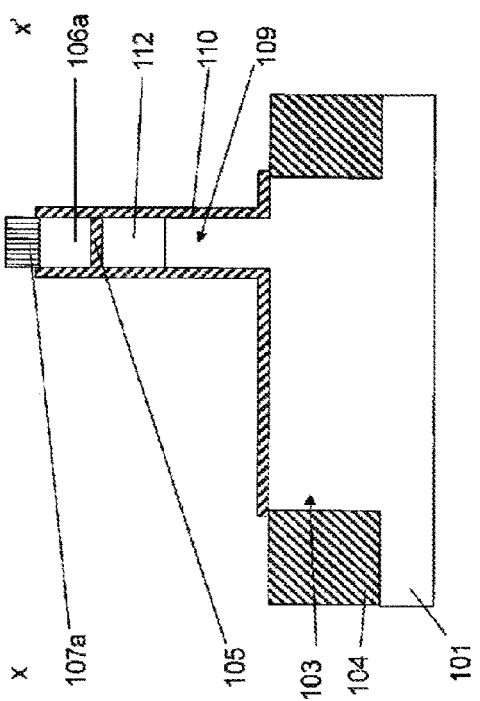
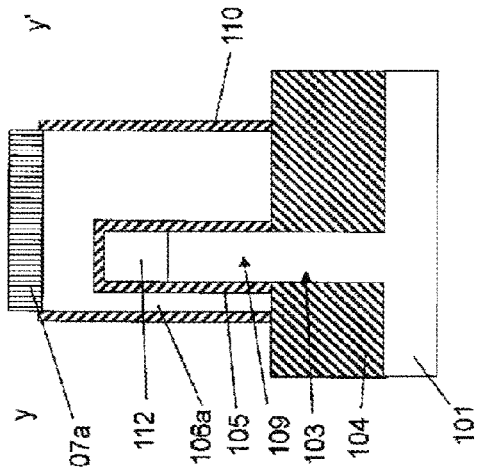
FIG. 16A
FIG. 16B
FIG. 16C

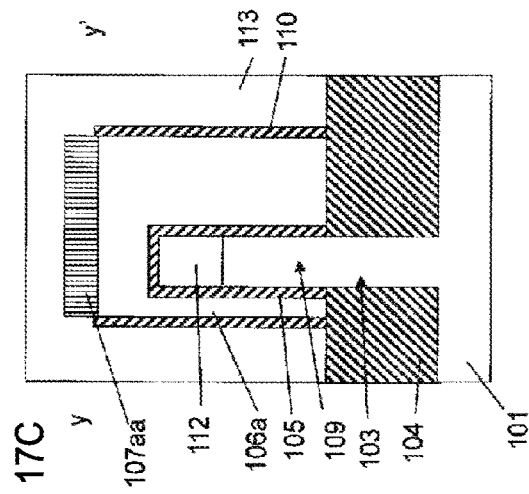
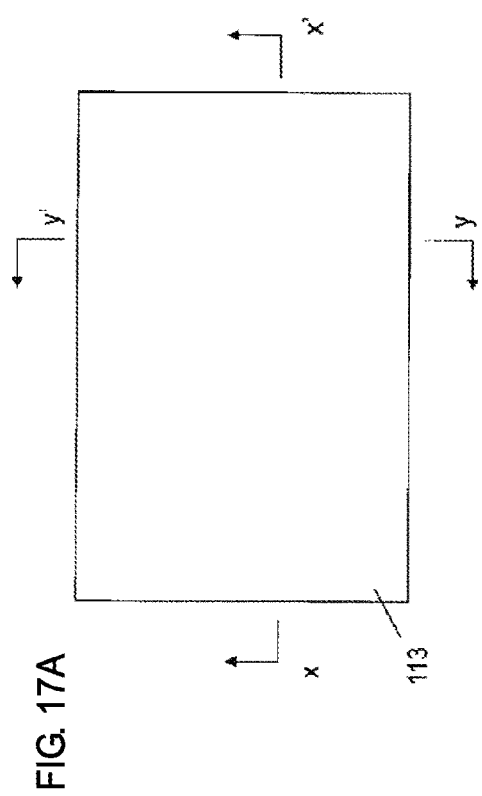
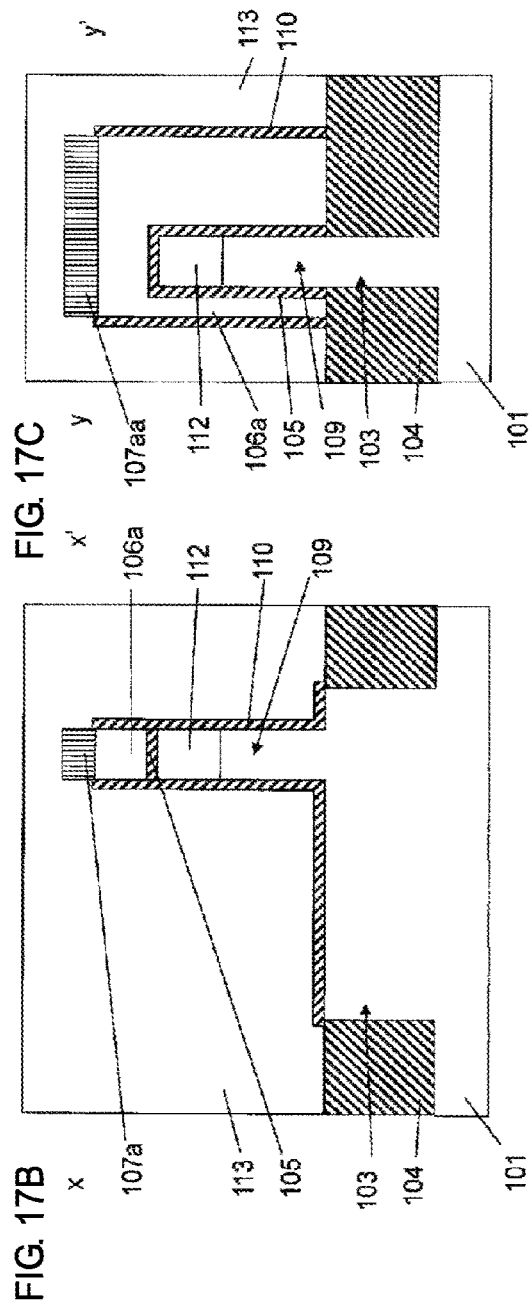

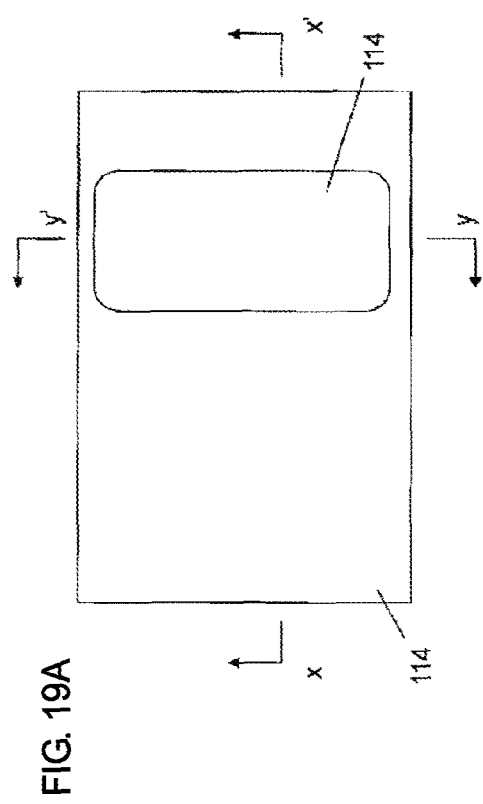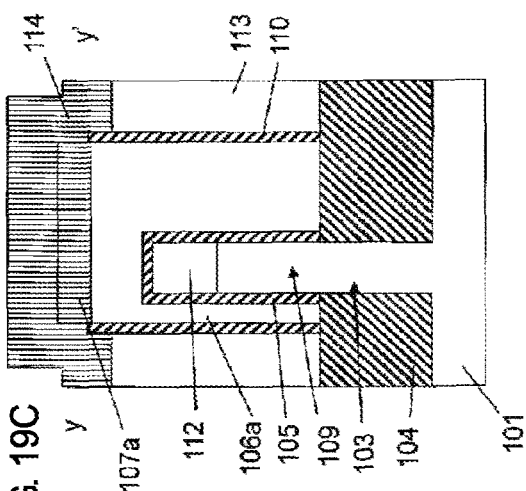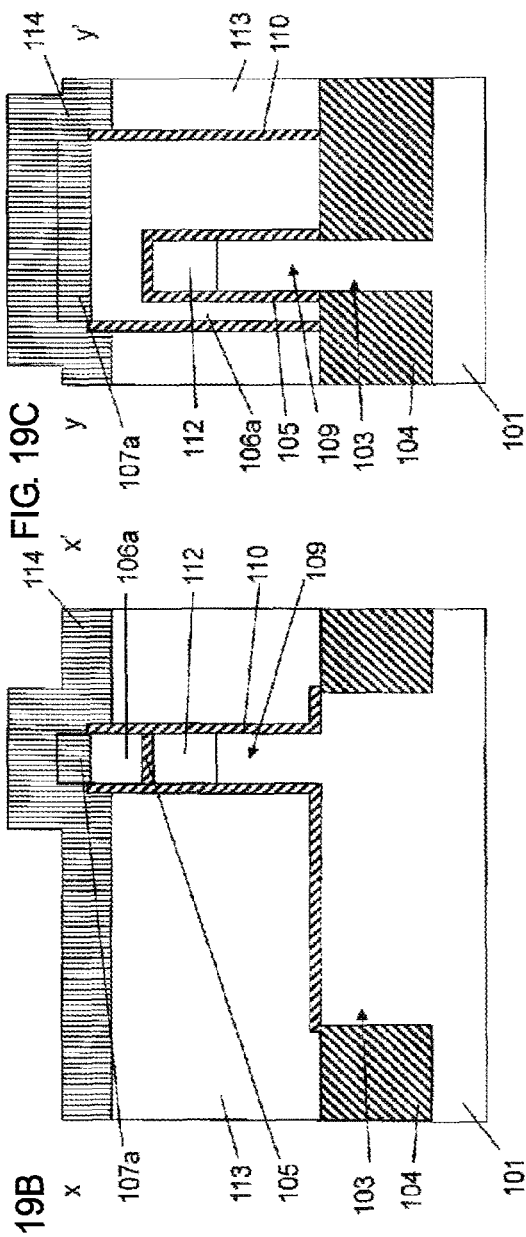

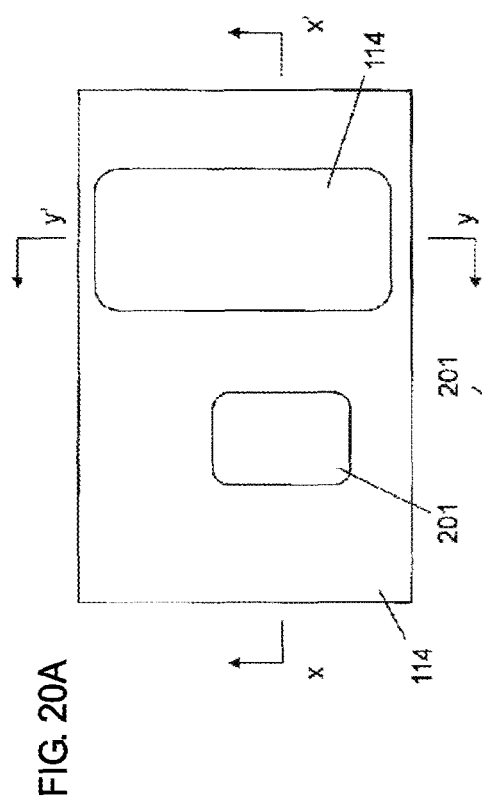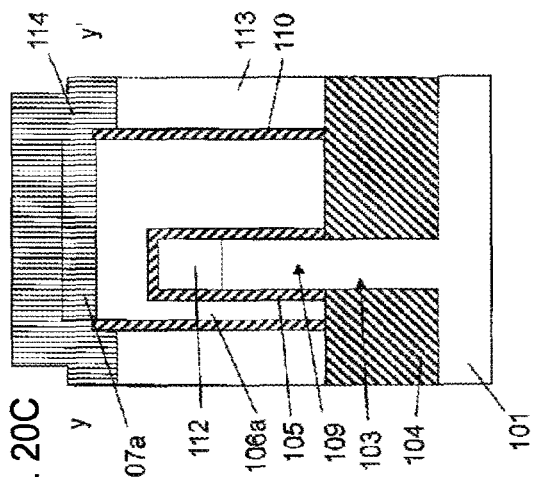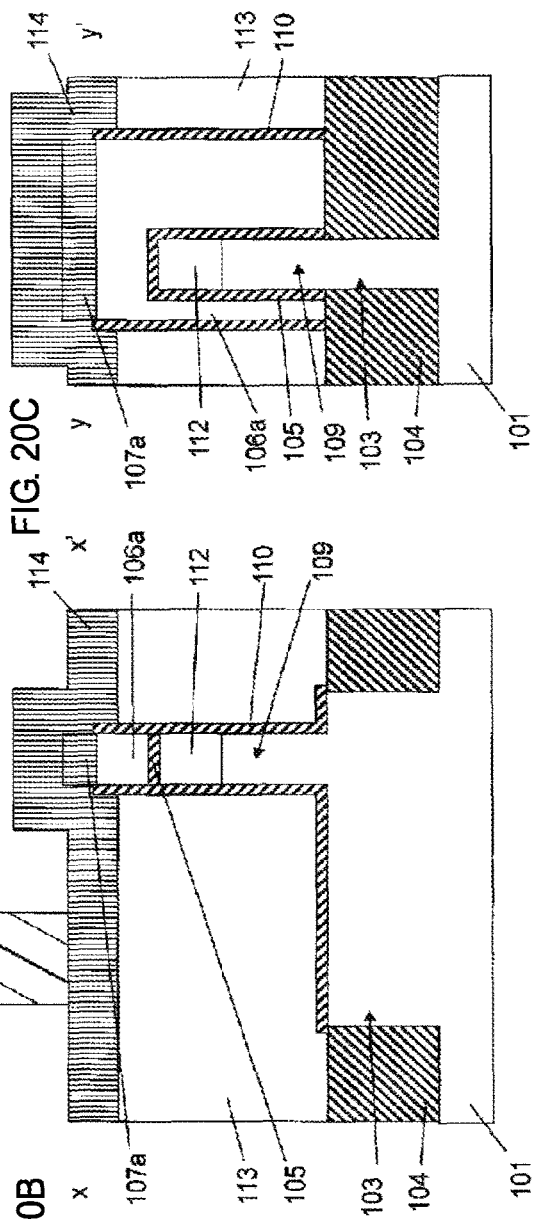

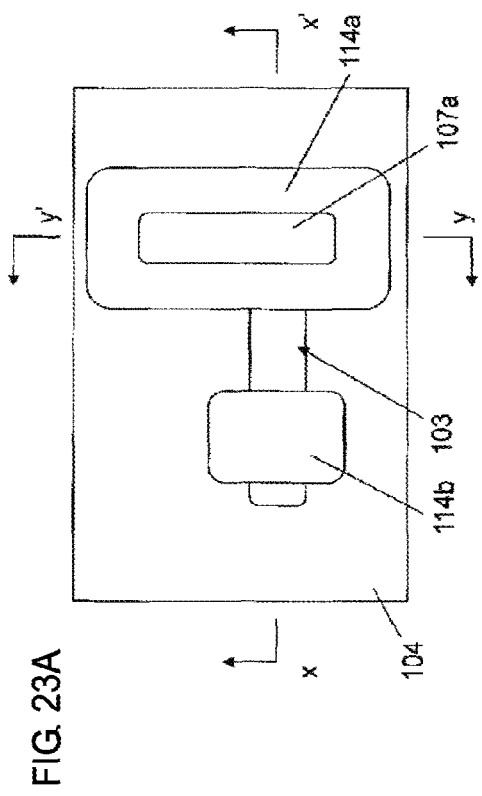
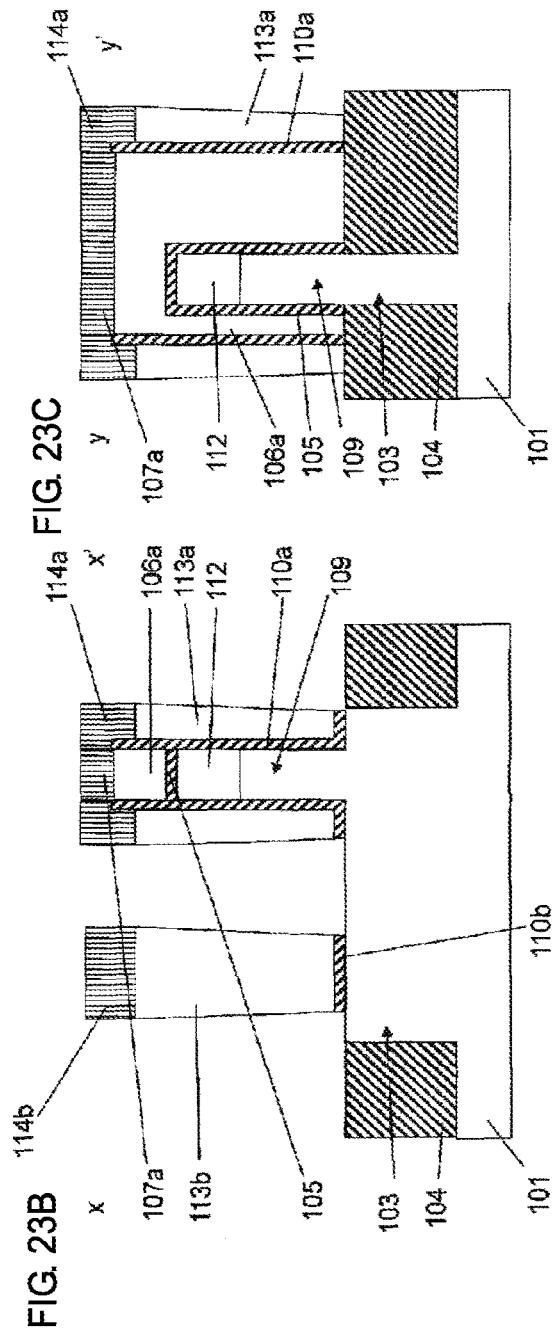
FIG. 23A
FIG. 23B
FIG. 23C

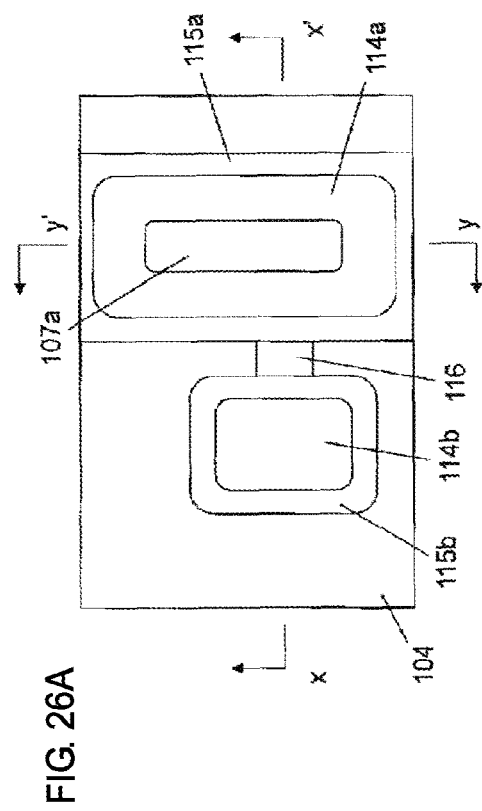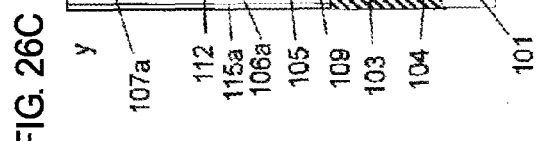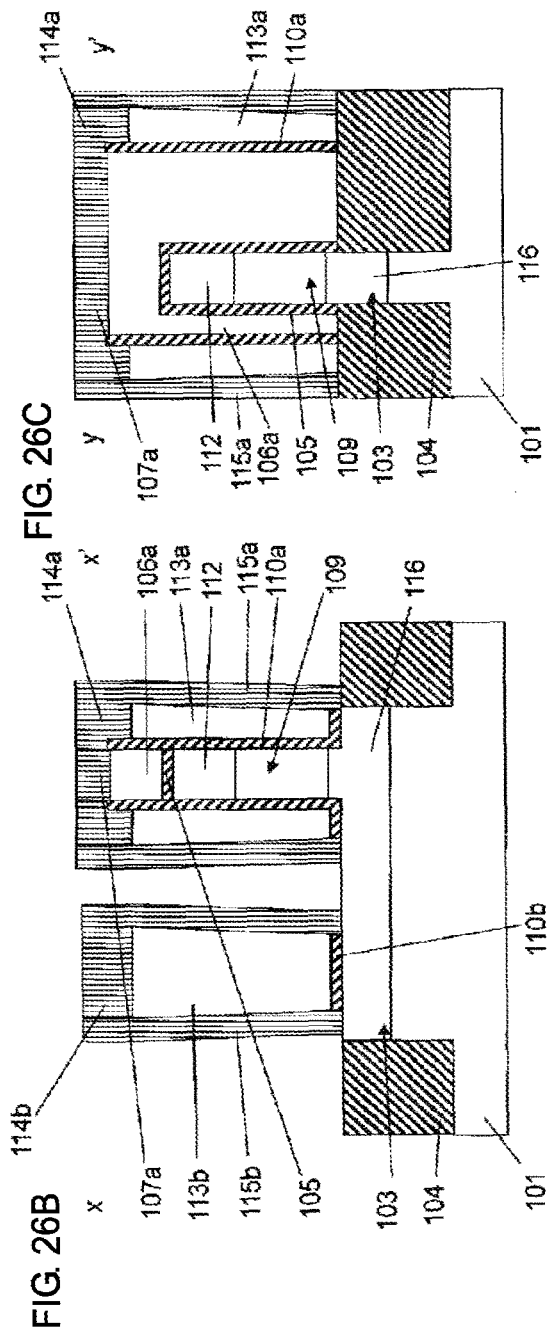

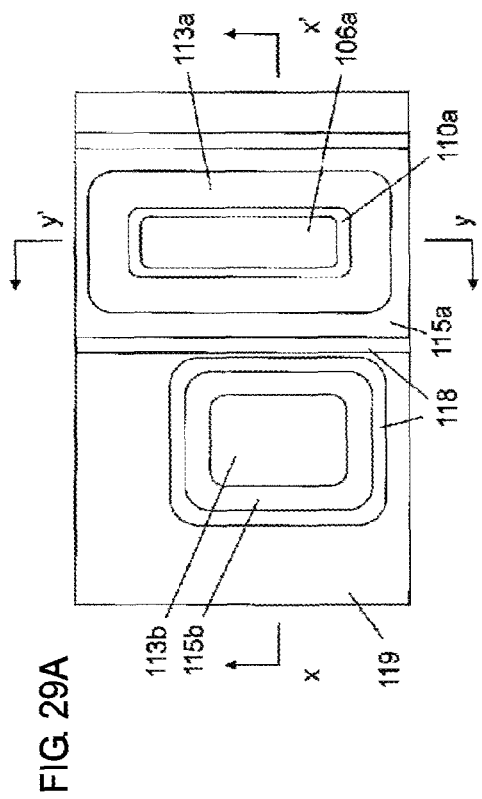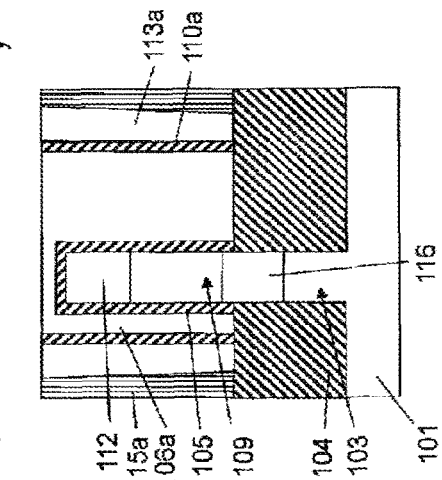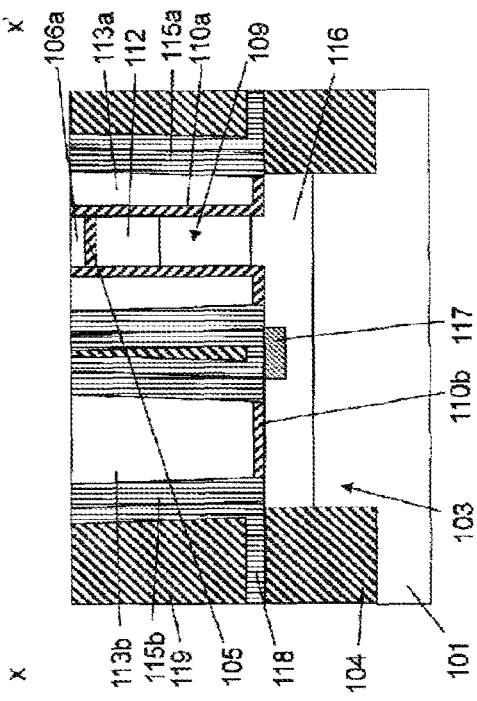
FIG. 29A
FIG. 29B
FIG. 29C

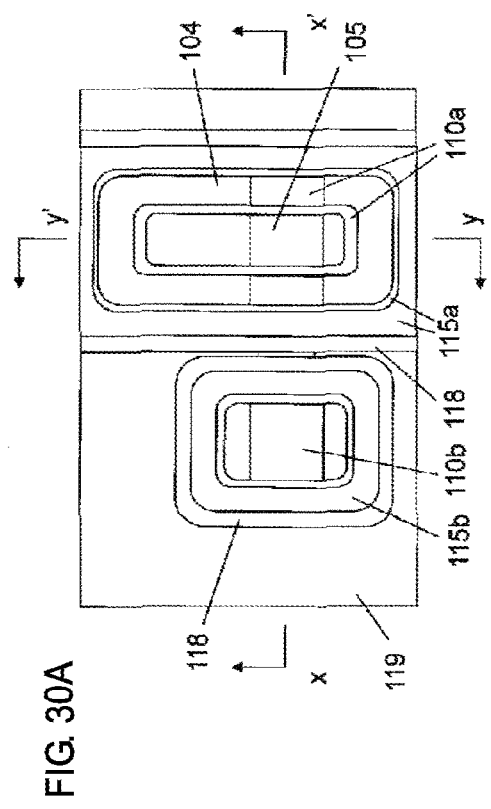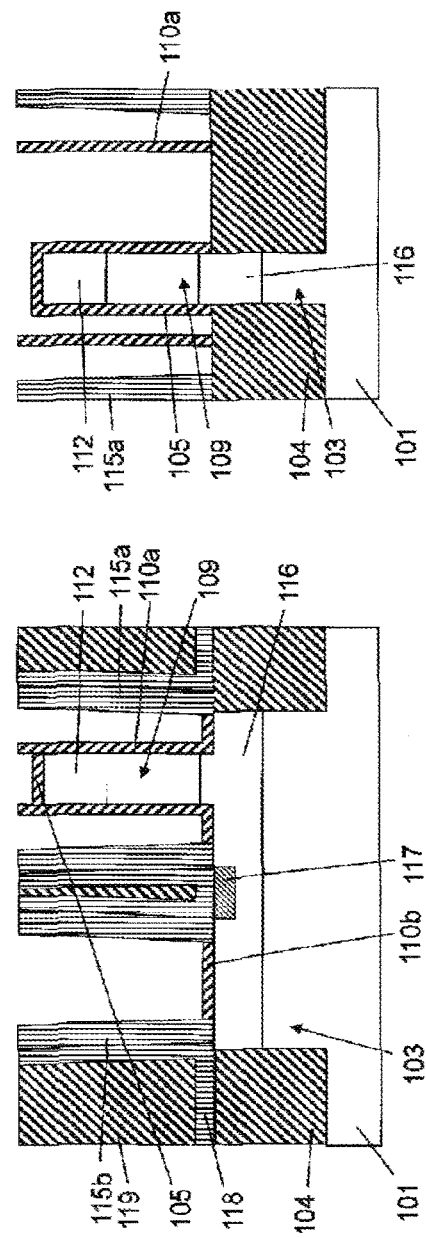
FIG. 30A
FIG. 30B
FIG. 30C

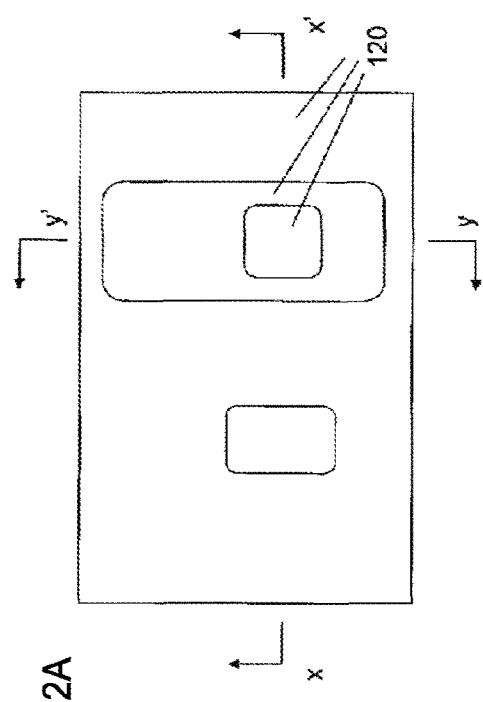
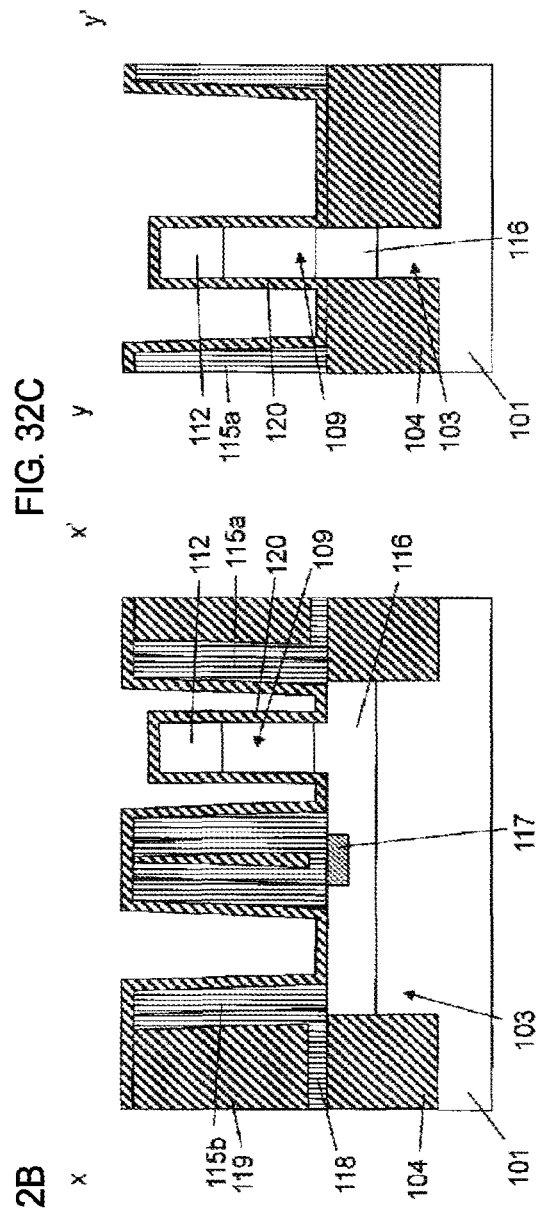
FIG. 32A
FIG. 32B
FIG. 32C

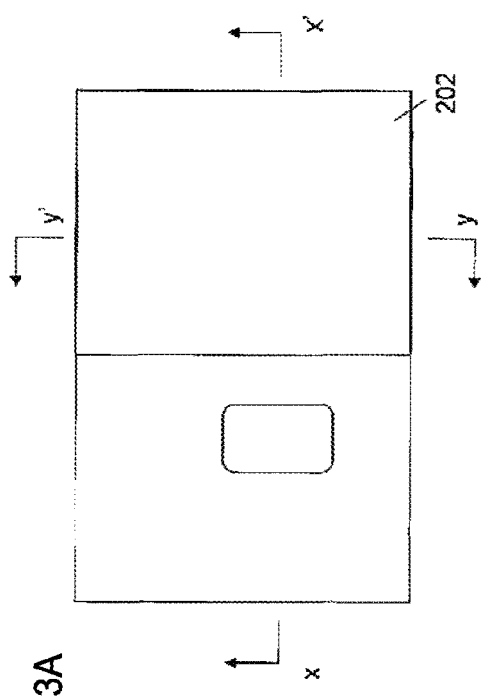
FIG. 33A
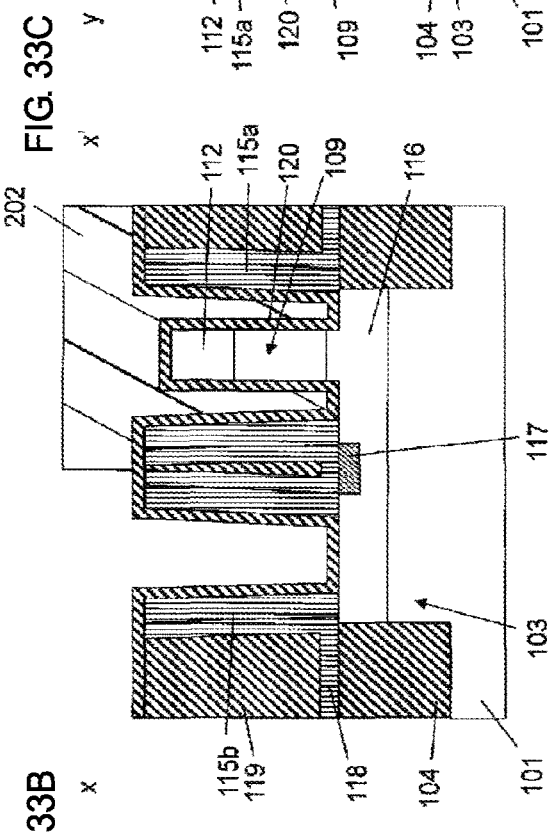
FIG. 33B
FIG. 33C

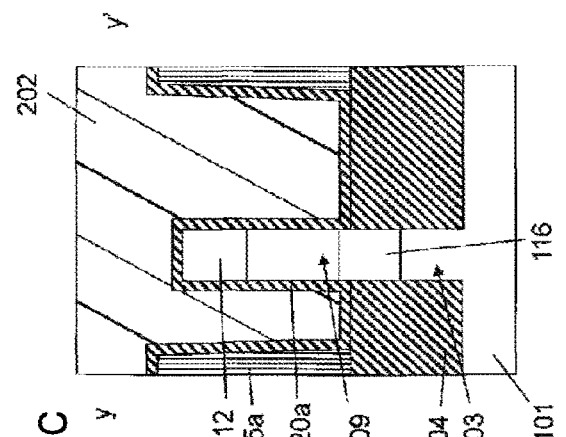
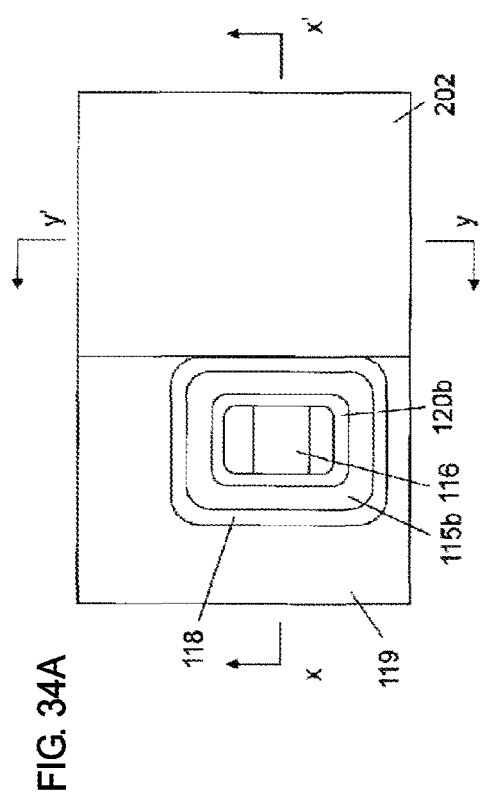
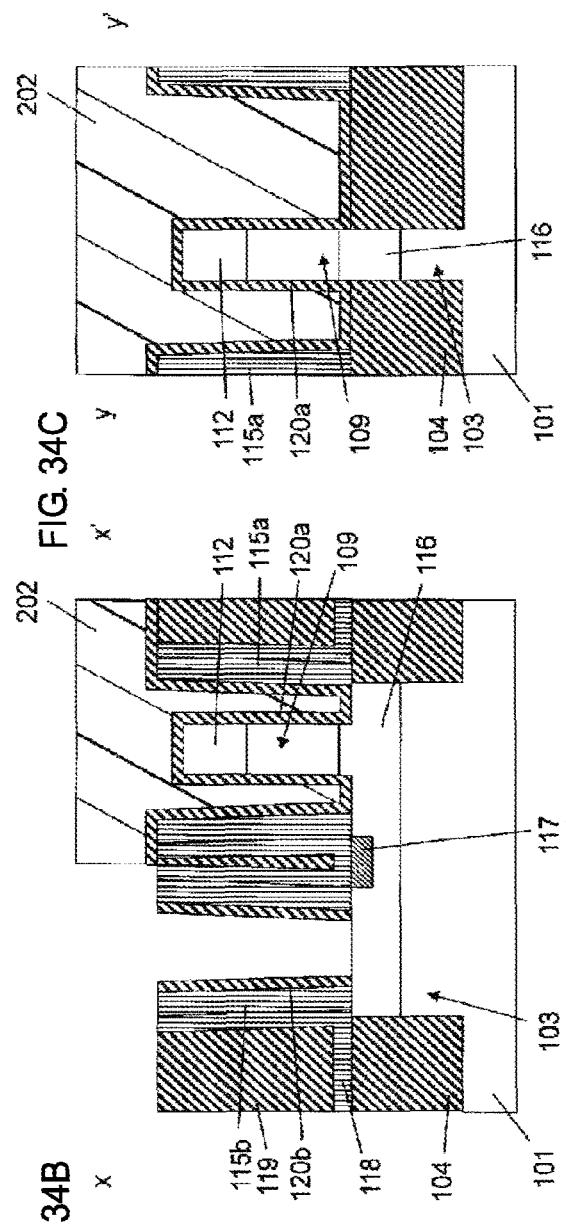

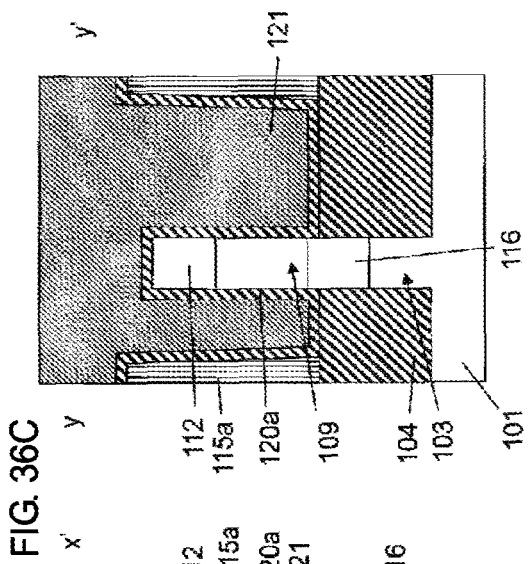
FIG. 36A
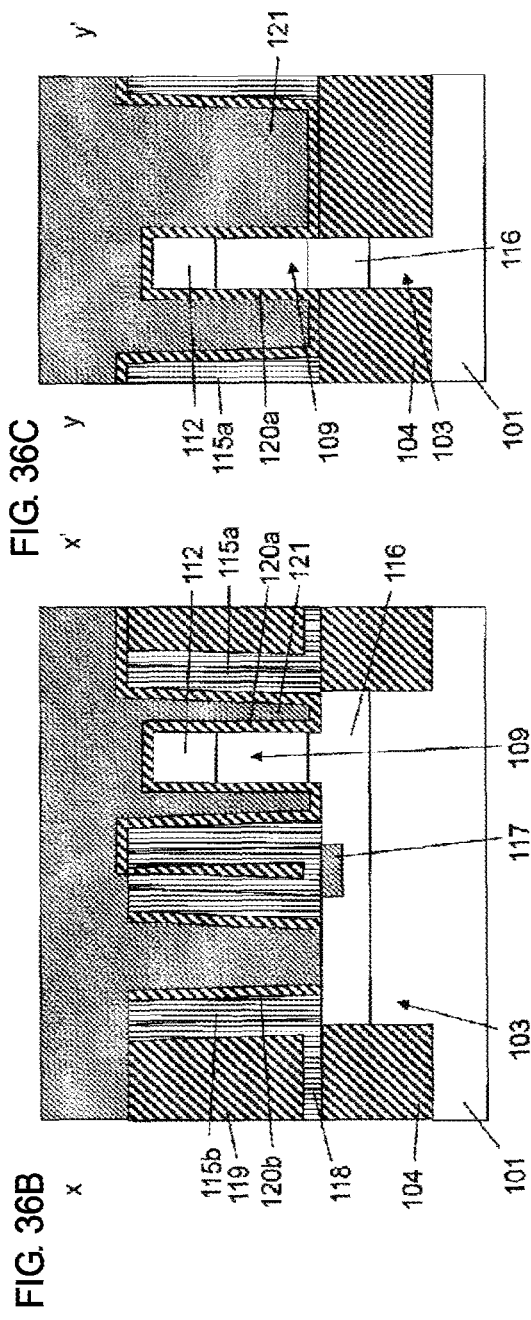
FIG. 36B
FIG. 36C

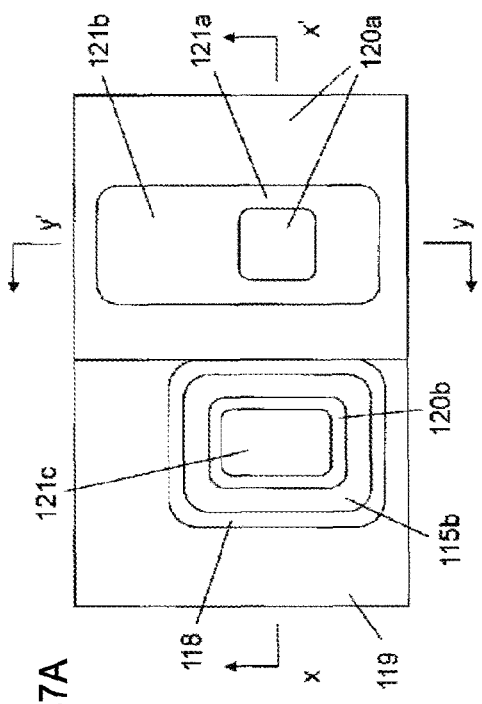
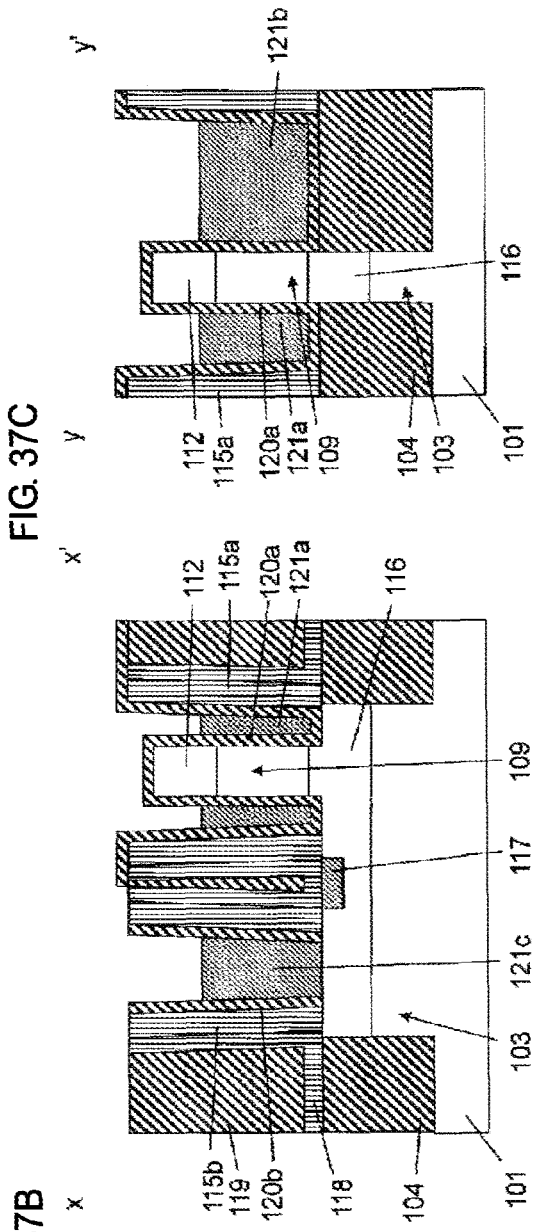
FIG. 37A
FIG. 37B
FIG. 37C

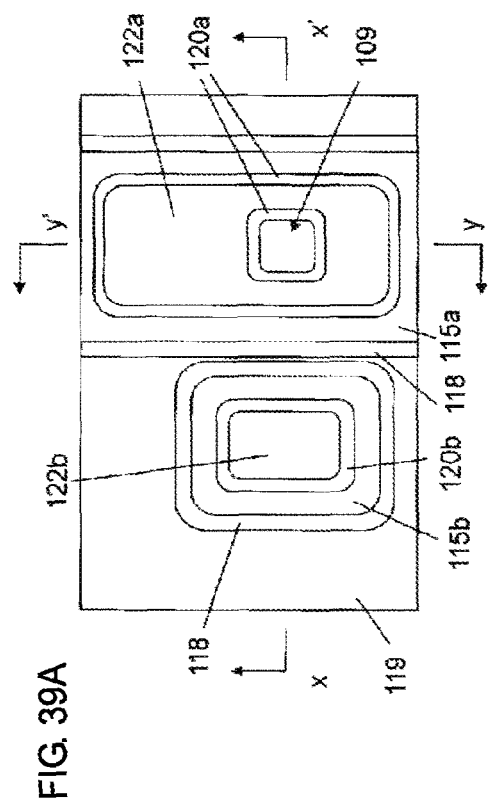
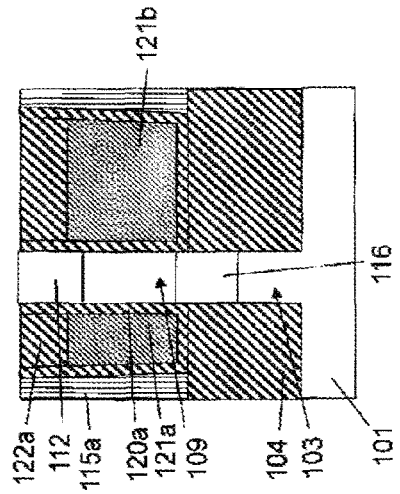
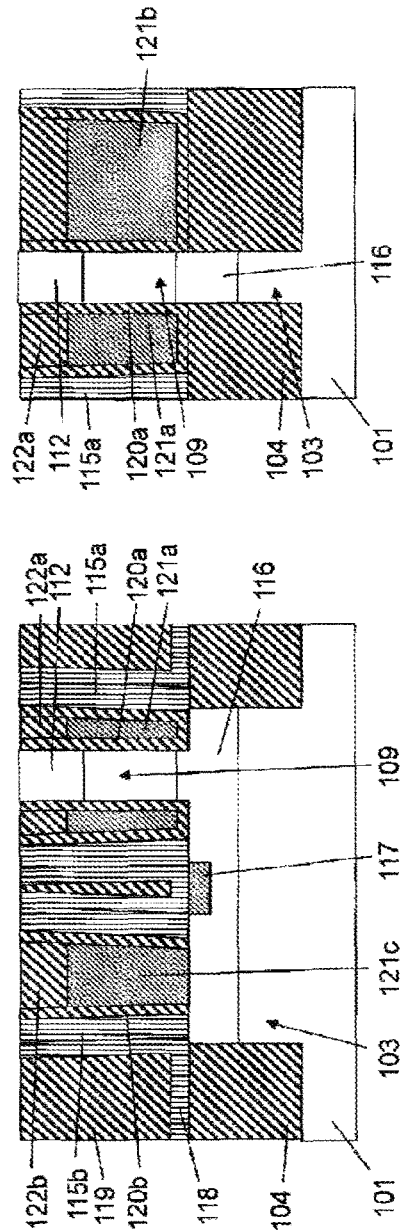
FIG. 39A
FIG. 39B
FIG. 39C

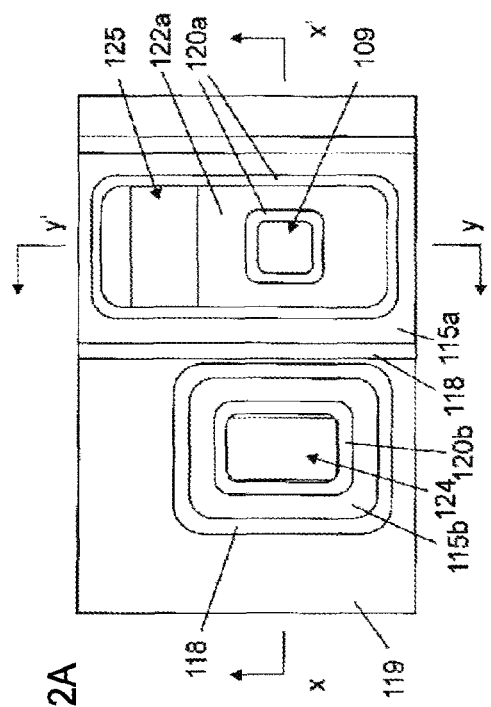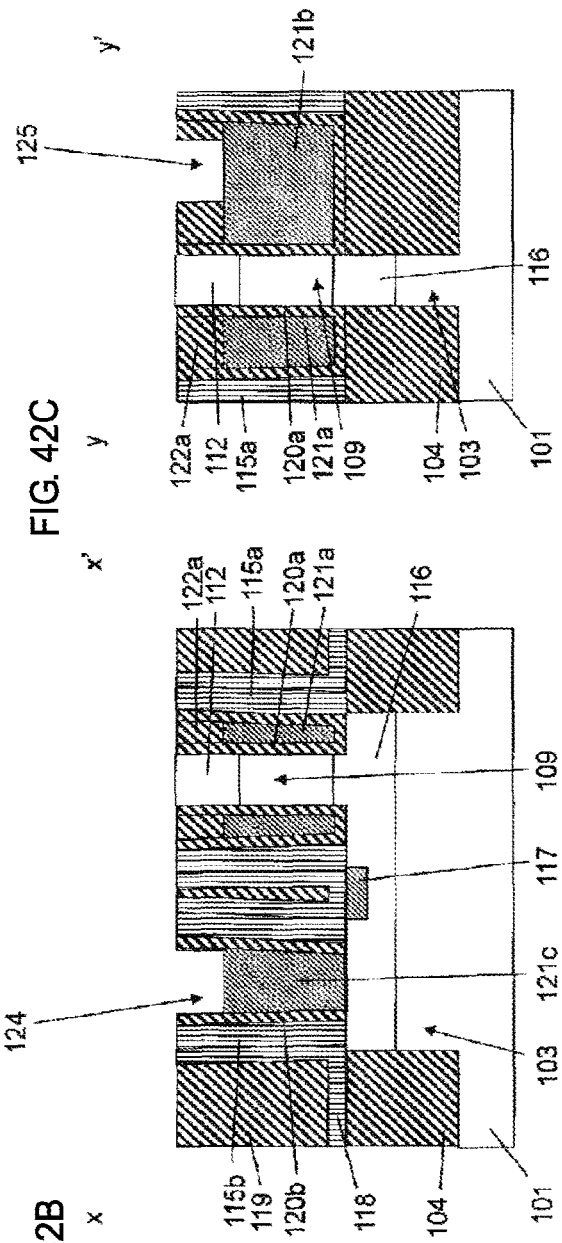

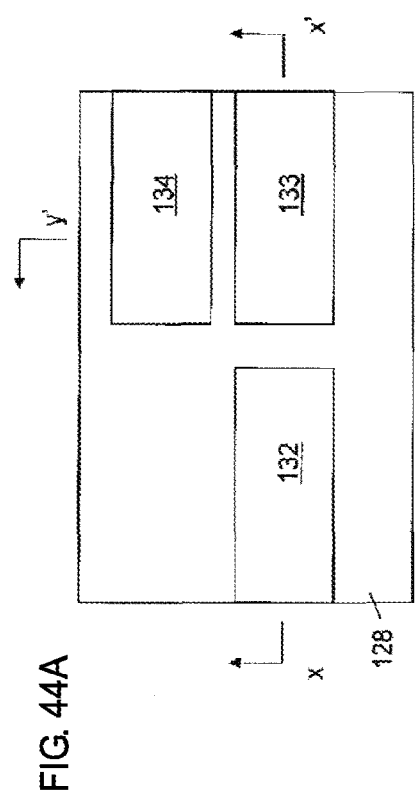
FIG. 44A
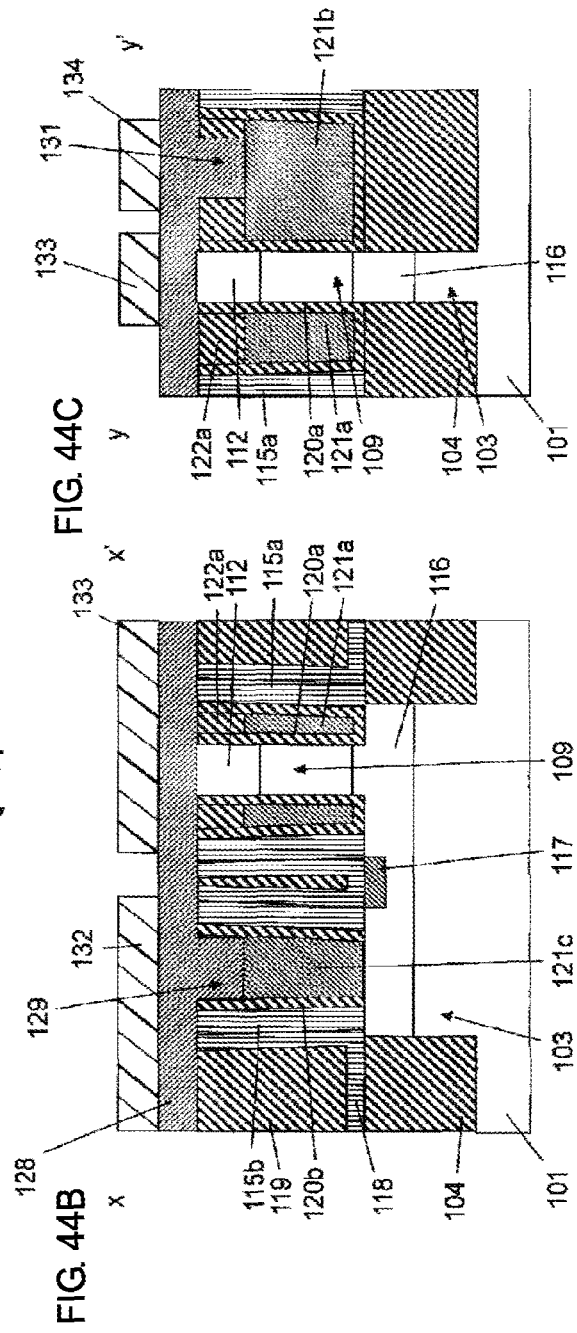
FIG. 44C
FIG. 44B

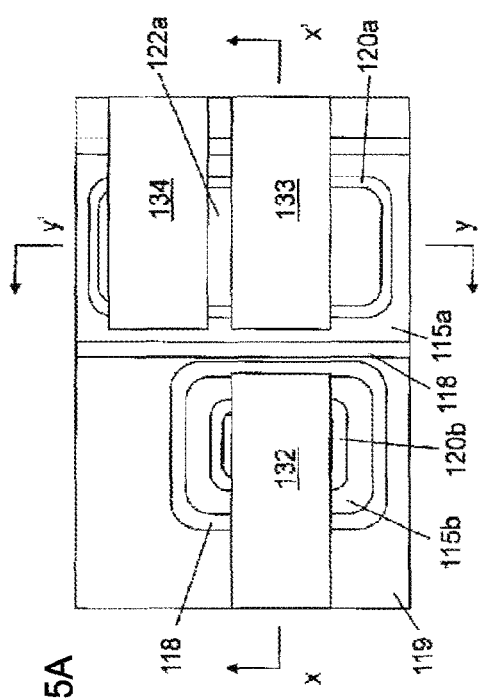
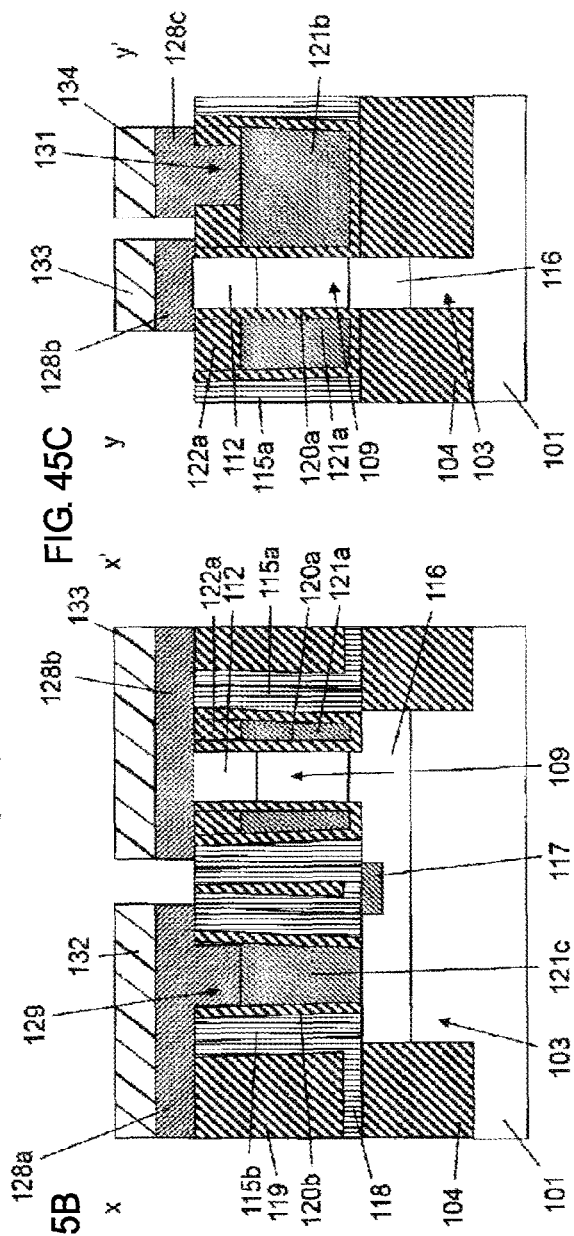
FIG. 45A
FIG. 45B
FIG. 45C

METHOD FOR PRODUCING SEMICONDUCTOR DEVICE

CROSS REFERENCE TO RELATED APPLICATIONS

This application is a divisional patent application of U.S. Patent Application Ser. No. 15/191,711 filed Jun. 24, 2016, which is a continuation of international patent application PCT/JP2014/055667, filed Mar. 5, 2014, the entire contents of which are incorporated herein by reference.

BACKGROUND

Field of the Invention

The present invention relates to a method for producing a semiconductor device and to a semiconductor device.

Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

According to a typical method for producing an SGT, a silicon pillar on which a pillar-shaped nitride film hard mask has been formed is formed by using a mask for forming the silicon pillar, a planar silicon layer is formed at the bottom portion of the silicon pillar by using a mask for forming the planar silicon layer, and a gate line is formed by using a mask for forming the gate line (e.g., refer to Japanese Unexamined Patent Application Publication No. 2009-182317). In other words, three masks are used to form a silicon pillar, a planar silicon layer, and a gate line.

In a typical method for producing an SGT, a deep contact hole is formed in order to connect an upper portion of a planar silicon layer and a metal wire (e.g., refer to Japanese Unexamined Patent Application Publication No. 2009-182317). With reduction in the size of devices, the aspect ratio (depth/diameter) of contact holes increases. The increase in the aspect ratio causes a decrease in the etching rate. Furthermore, with reduction in the size of a pattern, the thickness of a resist decreases. If the thickness of the resist decreases, the resist is also etched during etching, which makes it difficult to form a deep contact hole.

A metal gate-last process in which a metal gate is formed after a high-temperature process has been employed in actual production of typical MOS transistors in order to achieve both a metal gate process and a high-temperature process (refer to IEDM 2007, K. Mistry et. al, pp. 247-250). A gate is formed using polysilicon, an interlayer insulating film is deposited, the polysilicon gate is exposed by chemical mechanical polishing and etched, and then a metal is deposited. Thus, a metal gate-last process in which a metal gate is formed after a high-temperature process needs to be also employed in making SGTs in order to achieve both a metal gate process and a high-temperature process.

If an upper portion of a hole is narrower than a lower portion of the hole during filling with a metal, the upper portion of the hole is filled with the metal first, resulting in formation of holes.

In typical MOS transistors, a first insulating film is used to decrease parasitic capacitance between the gate line and the substrate. For example, in a FINFET (refer to IEDM 2010 CC. Wu, et. al, 27.1.1-27.1.4), a first insulating film is formed around one fin-shaped semiconductor layer and etched back to expose the fin-shaped semiconductor layer in order to decrease parasitic capacitance between the gate line and the substrate. Accordingly, the first insulating film needs to be also used in an SGT in order to decrease parasitic capacitance between the gate line and the substrate. Since such an SGT includes a pillar-shaped semiconductor layer in addition to a fin-shaped semiconductor layer, special consideration is required to form the pillar-shaped semiconductor layer.

BRIEF SUMMARY

Accordingly, it is an object to provide a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

The method for producing a semiconductor device according to an aspect of the present invention includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

An upper surface of the second dummy gate may have a larger area than a lower surface of the second dummy gate.

The method may further include, after the fourth insulating film is formed around the pillar-shaped semiconductor layer and the first dummy gate, forming a third resist, etching back the third resist to expose an upper portion of the pillar-shaped semiconductor layer, and forming a first diffusion layer in an upper portion of the pillar-shaped semiconductor layer.

The method may further include a fourth step of forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

The method may further include a fifth step of, after the fourth step, depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

A semiconductor device according to another aspect of the present invention includes a fin-shaped semiconductor layer formed on a semiconductor substrate, a first insulating film formed around the fin-shaped semiconductor layer, a first contact formed on the fin-shaped semiconductor layer, and a gate insulating film formed around the first contact.

An upper surface of the first contact may have a larger area than a lower surface of the first contact.

The semiconductor device may also include a pillar-shaped semiconductor layer formed on the fin-shaped semiconductor layer, a gate insulating film formed around the pillar-shaped semiconductor layer, a gate electrode formed around the gate insulating film and made of a metal, a gate line connected to the gate electrode, extending in a direction perpendicular to a direction in which the fin-shaped semiconductor layer extends, and made of the metal, a first diffusion layer formed in an upper portion of the pillar-shaped semiconductor layer, and a second diffusion layer formed in an upper portion of the fin-shaped semiconductor layer and a lower portion of the pillar-shaped semiconductor layer, wherein an upper surface of the gate electrode and the gate line has a larger area than a lower surface of the gate electrode and the gate line.

The gate insulating film may also be formed around and at bottom portions of the gate electrode and the gate line.

According to the present invention, there can be provided a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed, and an SGT structure obtained by the method.

The method for producing a semiconductor device includes a first step of forming a fin-shaped semiconductor layer on a semiconductor substrate and forming a first insulating film around the fin-shaped semiconductor layer; a second step of, after the first step, forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step of, after the second step, forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer. Thus, a fin-shaped semiconductor layer, a pillar-shaped semiconductor layer, a gate electrode, and a gate line can be formed by self-alignment, which decreases the number of steps.

A gate electrode, a gate line, and a first contact can be formed by simultaneously forming the second dummy gate and the first dummy contact, then depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal. Therefore, etching may be performed by the thickness of the gate insulating film, and thus a step of forming a deep contact hole is not required.

Since the gate insulating film at the bottom portion of the region where the first dummy contact has been present has been removed, the gate insulating film remains on an inner surface of the fifth insulating film in the region where the first dummy contact has been present. The gate insulating film is a highly insulating film formed by atomic layer deposition, and thus can insulate the first contact from the surrounding structure.

The first and second hard masks prevent the formation of a metal-semiconductor compound on the first and second dummy gates. Thus, a metal-semiconductor compound can be formed only on the fin-shaped semiconductor layer.

When the second polysilicon is etched, by employing reverse-taper etching, the area of an upper surface of the second dummy gate can be made larger than that of a lower surface of the second dummy gate. Thus, in filling with a metal for forming a gate, the formation of holes can be prevented. At the same time, the area of an upper surface of the first dummy contact can be made larger than that of a lower surface of the first dummy contact. Thus, in filling with a metal for a first contact, the formation of holes can be prevented.

A typical metal gate-last production process can be employed which includes forming a first dummy gate and a second dummy gate using a polysilicon, depositing an interlayer insulating film, performing chemical mechanical polishing to expose the first dummy gate and the second dummy gate, etching the polysilicon gate, and then depositing a metal. Therefore, a metal gate SGT can be easily produced.

The gate insulating film formed around and at bottom portions of the gate electrode and the gate line can insulate the gate electrode and the gate line from the pillar-shaped semiconductor layer and the fin-shaped semiconductor layer.

Other features which are considered as characteristic for the invention are set forth in the appended claims.

Although the invention is illustrated and described herein as embodied in a method of producing a semiconductor device and in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 1A is a plan view illustrating a semiconductor device according to an embodiment of the present invention, FIG. 1B is a sectional view taken along line X-X' in FIG. 1A, and FIG. 1C is a sectional view taken along line Y-Y' in FIG. 1A.

FIG. 3A is a plan view illustrating a method for producing a semiconductor device according to an embodiment of the present invention, FIG. 3B is a sectional view taken along line X-X' in FIG. 3A, and FIG. 3C is a sectional view taken along line Y-Y' in FIG. 3A.

FIG. 4A is a plan view illustrating a method for producing a semiconductor device according to an embodiment of the present invention, FIG. 4B is a sectional view taken along line X-X' in FIG. 4A, and FIG. 4C is a sectional view taken along line Y-Y' in FIG. 4A.

FIG. 5A is a plan view illustrating a method for producing a semiconductor device according to an embodiment of the present invention, FIG. 5B is a sectional view taken along line X-X' in FIG. 5A, and FIG. 5C is a sectional view taken along line Y-Y' in FIG. 5A.

FIG. 6A is a plan view illustrating a method for producing a semiconductor device according to an embodiment of the present invention, FIG. 6B is a sectional view taken along line X-X' in FIG. 6A, and FIG. 6C is a sectional view taken along line Y-Y' in FIG. 6A.

FIG. 7A is a plan view illustrating a method for producing a semiconductor device according to an embodiment of the present invention, FIG. 7B is a sectional view taken along line X-X' in FIG. 7A, and FIG. 7C is a sectional view taken along line Y-Y' in FIG. 7A.

FIG. 9A is a plan view illustrating a method for producing a semiconductor device according to an embodiment of the present invention, FIG. 9B is a sectional view taken along line X-X' in FIG. 9A, and FIG. 9C is a sectional view taken along line Y-Y' in FIG. 9A.

FIG. 10A is a plan view illustrating a method for producing a semiconductor device according to an embodiment of the present invention, FIG. 10B is a sectional view taken along line X-X' in FIG. 10A, and FIG. 100 is a sectional view taken along line Y-Y' in FIG. 10A.

FIG. 11A is a plan view illustrating a method for producing a semiconductor device according to an embodiment of the present invention, FIG. 11B is a sectional view taken along line X-X' in FIG. 11A, and FIG. 11C is a sectional view taken along line Y-Y' in FIG. 11A.

FIG. 12A is a plan view illustrating a method for producing a semiconductor device according to an embodiment of the present invention, FIG. 12B is a sectional view taken along line X-X' in FIG. 12A, and FIG. 12C is a sectional view taken along line Y-Y' in FIG. 12A.

FIG. 16A is a plan view illustrating a method for producing a semiconductor device according to an embodiment of the present invention, FIG. 16B is a sectional view taken along line X-X' in FIG. 16A, and FIG. 16C is a sectional view taken along line Y-Y' in FIG. 16A.

FIG. 17A is a plan view illustrating a method for producing a semiconductor device according to an embodiment of the present invention, FIG. 17B is a sectional view taken along line X-X' in FIG. 17A, and FIG. 17C is a sectional view taken along line Y-Y' in FIG. 17A.

FIG. 19A is a plan view illustrating a method for producing a semiconductor device according to an embodiment of the present invention, FIG. 19B is a sectional view taken along line X-X' in FIG. 19A, and FIG. 19C is a sectional view taken along line Y-Y' in FIG. 19A.

FIG. 20A is a plan view illustrating a method for producing a semiconductor device according to an embodiment of the present invention, FIG. 20B is a sectional view taken along line X-X' in FIG. 20A, and FIG. 20C is a sectional view taken along line Y-Y' in FIG. 20A.

FIG. 23A is a plan view illustrating a method for producing a semiconductor device according to an embodiment of the present invention, FIG. 23B is a sectional view taken along line X-X' in FIG. 23A, and FIG. 23C is a sectional view taken along line Y-Y' in FIG. 23A.

FIG. 26A is a plan view illustrating a method for producing a semiconductor device according to an embodiment of the present invention, FIG. 26B is a sectional view taken along line X-X' in FIG. 26A, and FIG. 26C is a sectional view taken along line Y-Y' in FIG. 26A.

FIG. 29A is a plan view illustrating a method for producing a semiconductor device according to an embodiment of the present invention, FIG. 29B is a sectional view taken along line X-X' in FIG. 29A, and FIG. 29C is a sectional view taken along line Y-Y' in FIG. 29A.

FIG. 30A is a plan view illustrating a method for producing a semiconductor device according to an embodiment of the present invention, FIG. 30B is a sectional view taken along line X-X' in FIG. 30A, and FIG. 30C is a sectional view taken along line Y-Y' in FIG. 30A.

FIG. 32A is a plan view illustrating a method for producing a semiconductor device according to an embodiment of the present invention, FIG. 32B is a sectional view taken along line X-X' in FIG. 32A, and FIG. 32C is a sectional view taken along line Y-Y' in FIG. 32A.

FIG. 33A is a plan view illustrating a method for producing a semiconductor device according to an embodiment of the present invention, FIG. 33B is a sectional view taken along line X-X' in FIG. 33A, and FIG. 33C is a sectional view taken along line Y-Y' in FIG. 33A.

FIG. 34A is a plan view illustrating a method for producing a semiconductor device according to an embodiment of the present invention, FIG. 34B is a sectional view taken along line X-X' in FIG. 34A, and FIG. 34C is a sectional view taken along line Y-Y' in FIG. 34A.

FIG. 36A is a plan view illustrating a method for producing a semiconductor device according to an embodiment of the present invention, FIG. 36B is a sectional view taken along line X-X' in FIG. 36A, and FIG. 36C is a sectional view taken along line Y-Y' in FIG. 36A.

FIG. 37A is a plan view illustrating a method for producing a semiconductor device according to an embodiment of the present invention, FIG. 37B is a sectional view taken along line X-X' in FIG. 37A, and FIG. 37C is a sectional view taken along line Y-Y' in FIG. 37A.

FIG. 39A is a plan view illustrating a method for producing a semiconductor device according to an embodiment of the present invention, FIG. 39B is a sectional view taken along line X-X' in FIG. 39A, and FIG. 39C is a sectional view taken along line Y-Y' in FIG. 39A.

FIG. 42A is a plan view illustrating a method for producing a semiconductor device according to an embodiment of the present invention, FIG. 42B is a sectional view taken along line X-X' in FIG. 42A, and FIG. 42C is a sectional view taken along line Y-Y' in FIG. 42A.

FIG. 44A is a plan view illustrating a method for producing a semiconductor device according to an embodiment of the present invention, FIG. 44B is a sectional view taken along line X-X' in FIG. 44A, and FIG. 44C is a sectional view taken along line Y-Y' in FIG. 44A.

FIG. 45A is a plan view illustrating a method for producing a semiconductor device according to an embodiment of the present invention, FIG. 45B is a sectional view taken along line X-X' in FIG. 45A, and FIG. 45C is a sectional view taken along line Y-Y' in FIG. 45A.

DETAILED DESCRIPTION

Figure 46A:
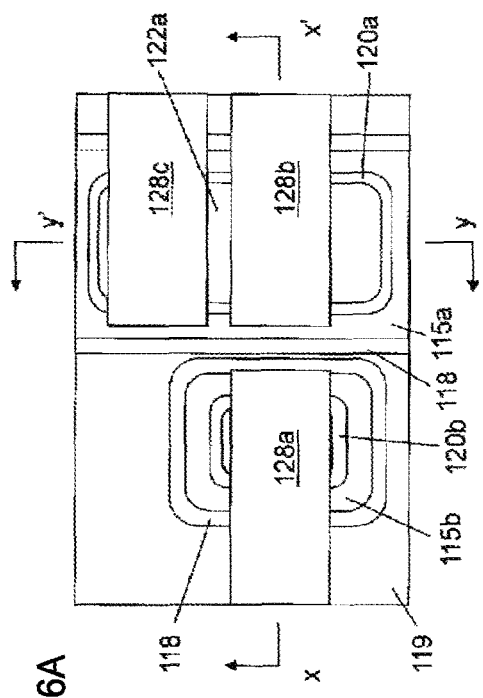
FIG. 46A is a plan view illustrating a method for producing a semiconductor device according to an embodiment of the present invention.
Figure 46C:
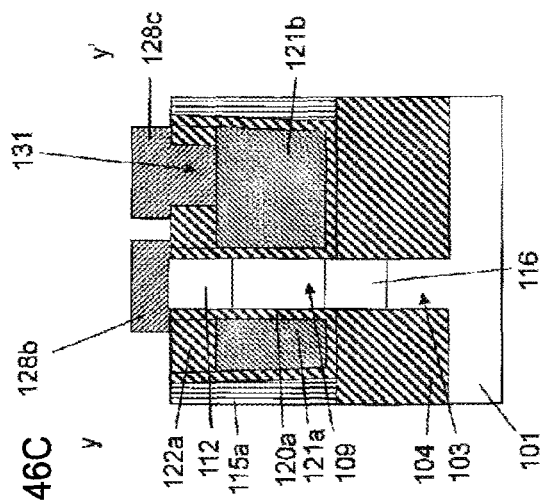
FIG. 46C is a sectional view taken along line Y-Y' in FIG. 46A.

Referring now to the figures of the drawing in detail, a production process for forming an SGT structure according to an embodiment of the present invention will be described with reference to FIG. 2A, 2B, and FIG. 46C.

Described first is a first step that includes forming a fin-shaped semiconductor layer on a semiconductor substrate and forming a first insulating film around the fin-shaped semiconductor layer. In this embodiment, a silicon substrate is used, but any semiconductor substrate other than the silicon substrate may be used.

Figure 2A:
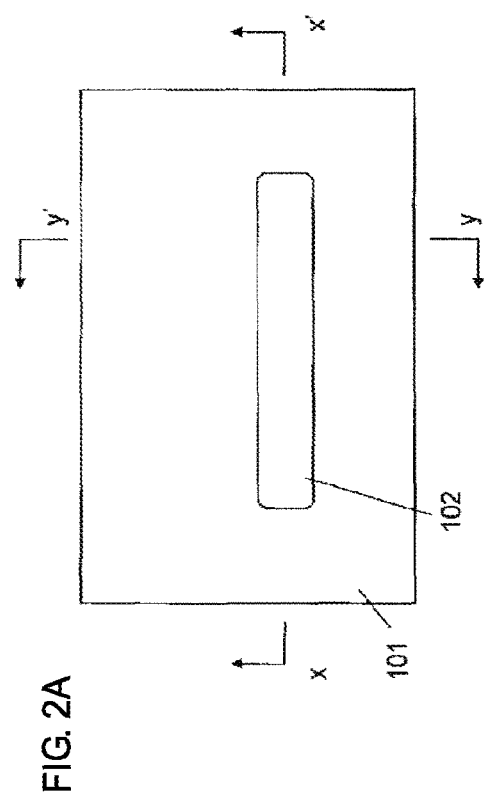
FIG. 2A is a plan view illustrating a method for producing a semiconductor device according to an embodiment of the present invention.
Figure 2C:
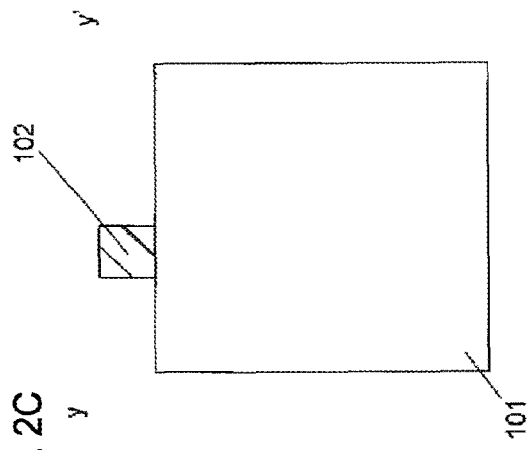
FIG. 2C is a sectional view taken along line Y-Y' in FIG. 2A.
Figure 2B:
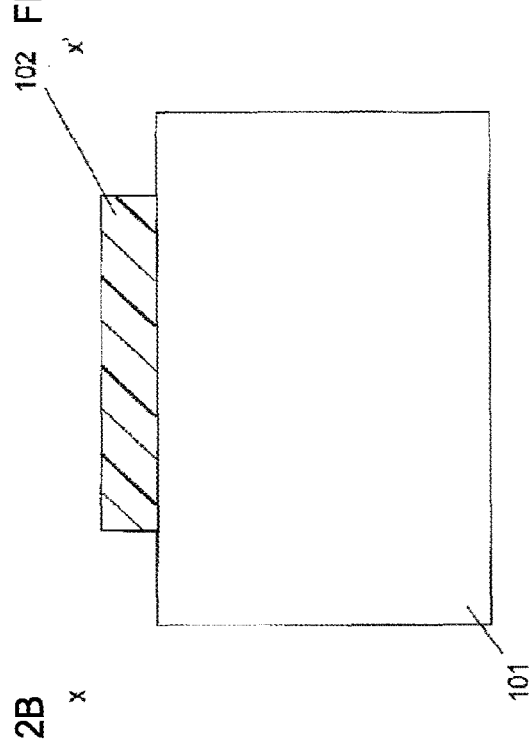
FIG. 2B is a sectional view taken along line X-X' in FIG. 2A.

As illustrated in FIGS. 2A, 2B, and 2C, a first resist 102 for forming a fin-shaped silicon layer is formed on a silicon substrate 101.

As illustrated in FIGS. 3A, 3B, and 3C, the silicon substrate 101 is etched to form a fin-shaped silicon layer 103. Herein, the fin-shaped silicon layer has been formed using a resist as a mask, but a hard mask such as an oxide film or a nitride film may be used.

As illustrated in FIGS. 4A, 4B, and 4C, the first resist 102 is removed.

As illustrated in FIGS. 5A, 5B, and 5C, a first insulating film 104 is deposited around the fin-shaped silicon layer 103. An oxide film formed by high-density plasma or an oxide film formed by low-pressure chemical vapor deposition (CVD) may be used as the first insulating film.

As illustrated in FIGS. 6A, 6B, and 6C, the first insulating film 104 is etched back to expose an upper portion of the fin-shaped silicon layer 103. The process so far is the same as that of a method for making a fin-shaped silicon layer in IEDM 2010 CC. Wu, et. al, 27.1.1-27.1.4.

The description so far has shown a first step that includes forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

As illustrated in FIGS. 7A, 7B, and 7C, a second insulating film 105 is formed around the fin-shaped silicon layer 103. The second insulating film 105 is preferably an oxide film.

Figure 8A:
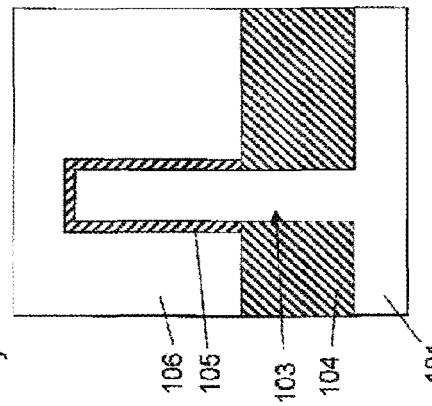
FIG. 8A is a plan view illustrating a method for producing a semiconductor device according to an embodiment of the present invention.
Figure 8B:
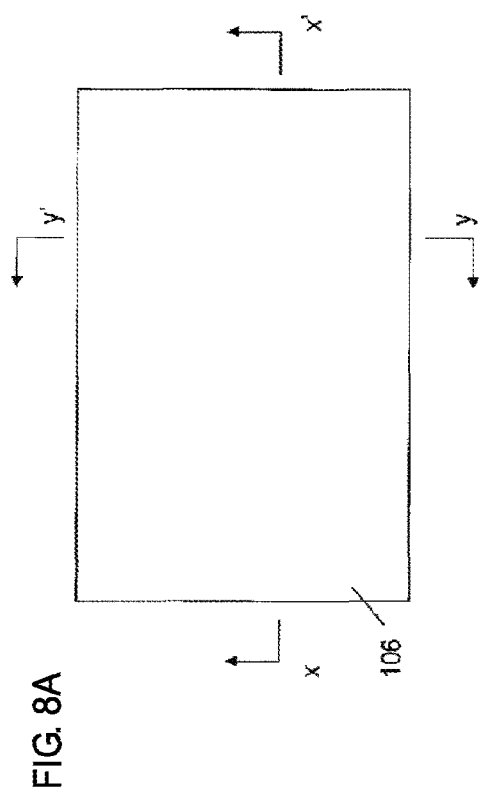
FIG. 8B is a sectional view taken along line X-X' in FIG. 8A.
Figure 8C:
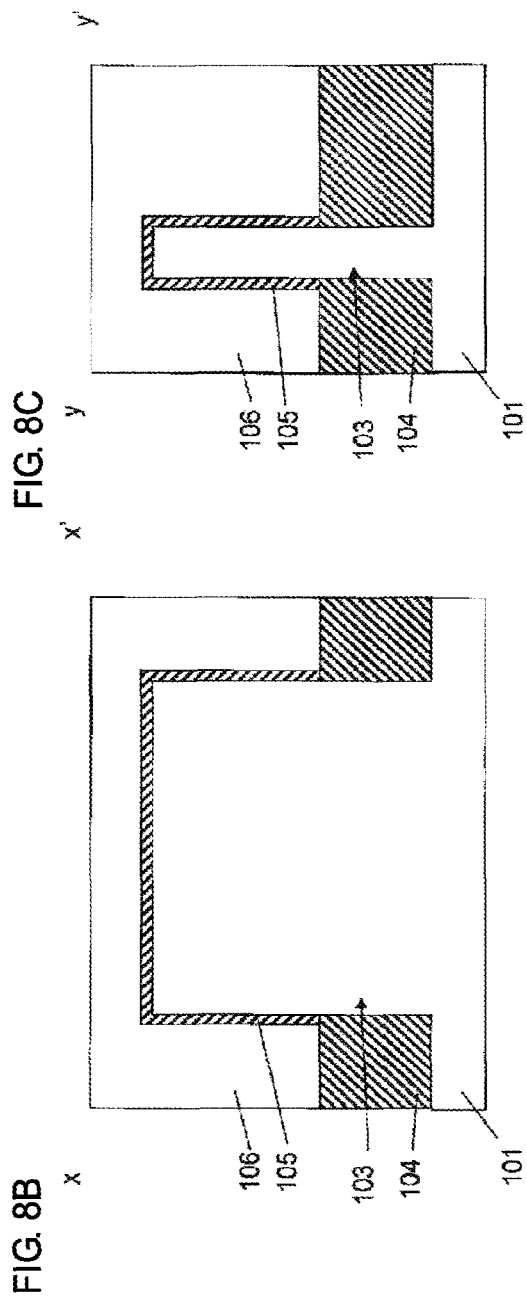
FIG. 8C is a sectional view taken along line Y-Y' in FIG. 8A.

As illustrated in FIGS. 8A, 8B, and 8C, a first polysilicon 106 is deposited on the second insulating film 105 and planarized.

As illustrated in FIGS. 9A, 9B, and 9C, a third insulating film 107 is formed on the first polysilicon 106. The third insulating film 107 is preferably a nitride film.

As illustrated in FIGS. 10A, 10B, and 10C, a second resist 108 for forming a gate line and a pillar-shaped silicon layer is formed in a direction perpendicular to a direction in which the fin-shaped silicon layer 103 extends.

As illustrated in FIGS. 11A, 11B, and 11C, the third insulating film 107, the first polysilicon 106, the second insulating film 105, and the fin-shaped silicon layer 103 are etched to form a pillar-shaped silicon layer 109, a first dummy gate 106a formed of the first polysilicon, and a first hard mask 107a formed of the third insulating film.

As illustrated in FIGS. 12A, 12B, and 12C, the second resist 108 is removed.

The description so far has shown a second step that includes forming a second insulating film around the fin-shaped semiconductor layer, depositing a first polysilicon on the second insulating film, planarizing the first polysilicon, forming a third insulating film on the first polysilicon, forming a second resist for forming a gate line and a pillar-shaped semiconductor layer in a direction perpendicular to a direction in which the fin-shaped semiconductor layer extends, and etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film.

Described next is a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

Figure 13A:
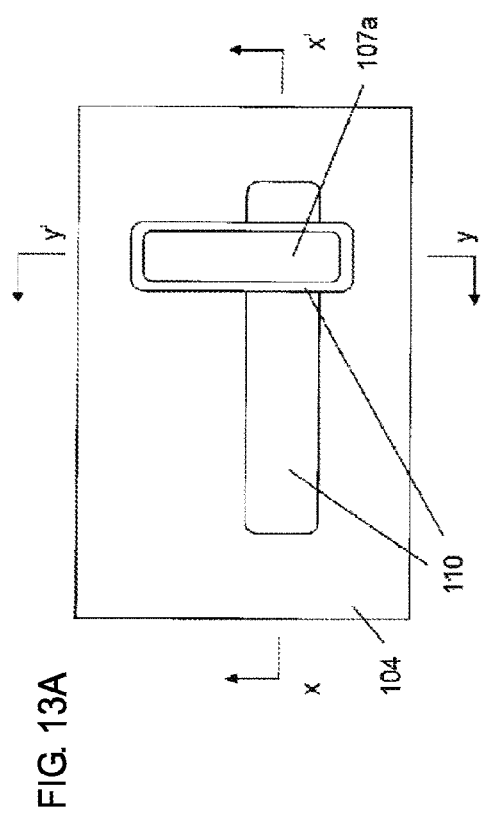
FIG. 13A is a plan view illustrating a method for producing a semiconductor device according to an embodiment of the present invention.
Figure 13C:
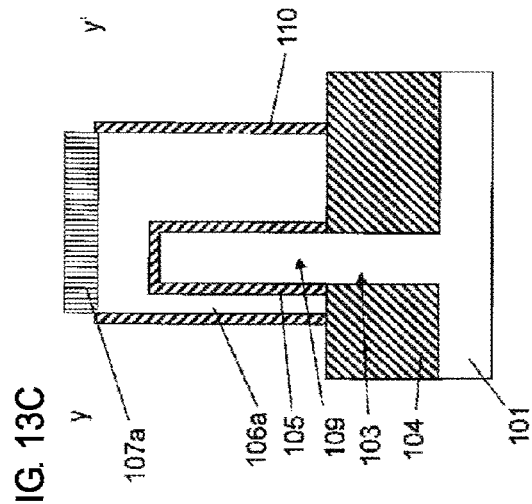
FIG. 13C is a sectional view taken along line Y-Y' in FIG. 13A.
Figure 13B:
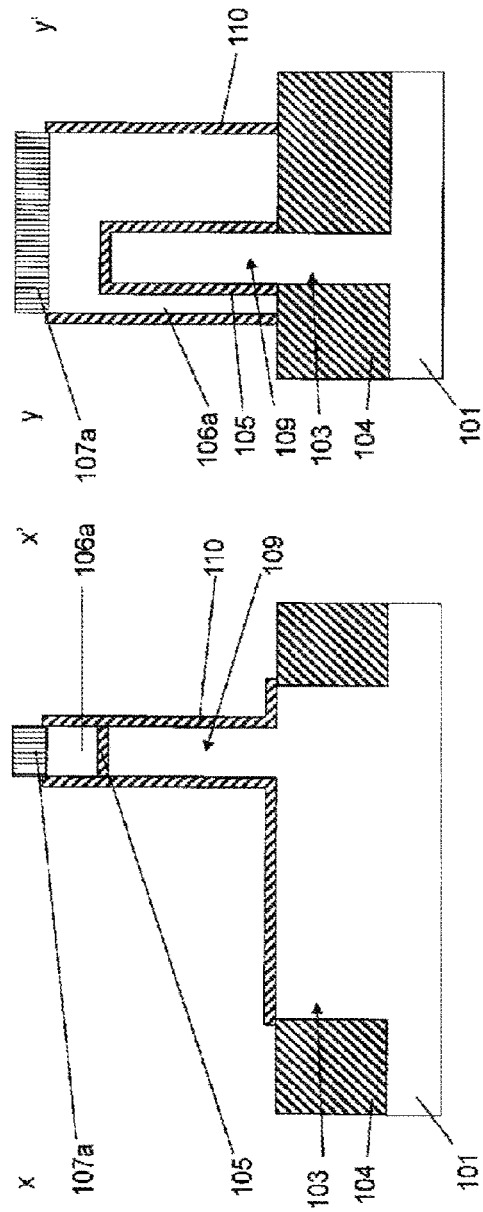
FIG. 13B is a sectional view taken along line X-X' in FIG. 13A.

As illustrated in FIGS. 13A, 13B, and 13C, a fourth insulating film 110 is formed around the pillar-shaped silicon layer 109 and the first dummy gate 106a. The fourth insulating film 110 is preferably an oxide film.

Figure 14A:
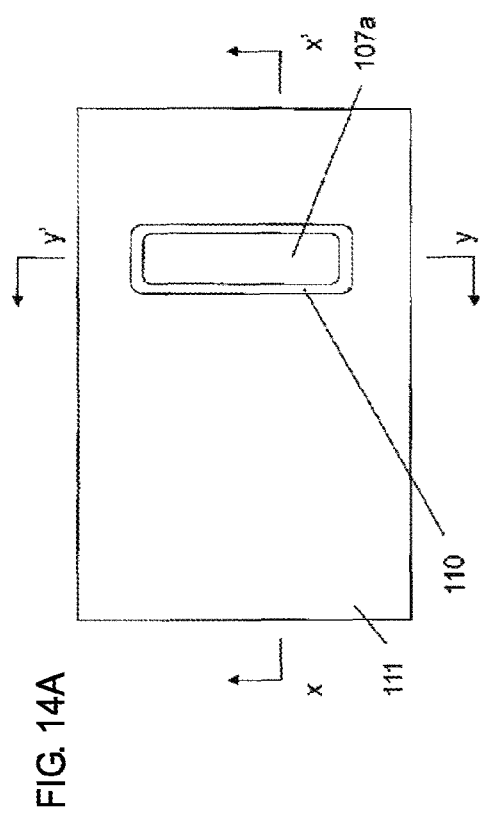
FIG. 14A is a plan view illustrating a method for producing a semiconductor device according to an embodiment of the present invention.
Figure 14C:
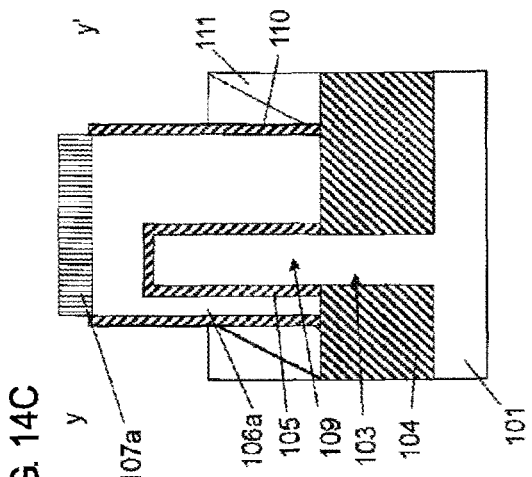
FIG. 14C is a sectional view taken along line Y-Y' in FIG. 14A.
Figure 14B:
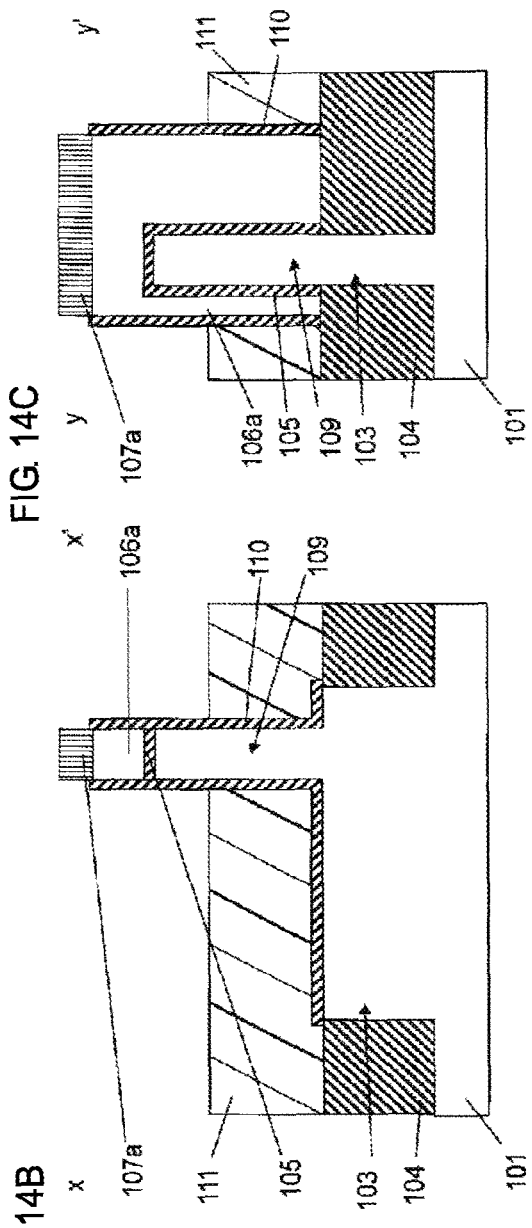
FIG. 14B is a sectional view taken along line X-X' in FIG. 14A.
Figure 15A:
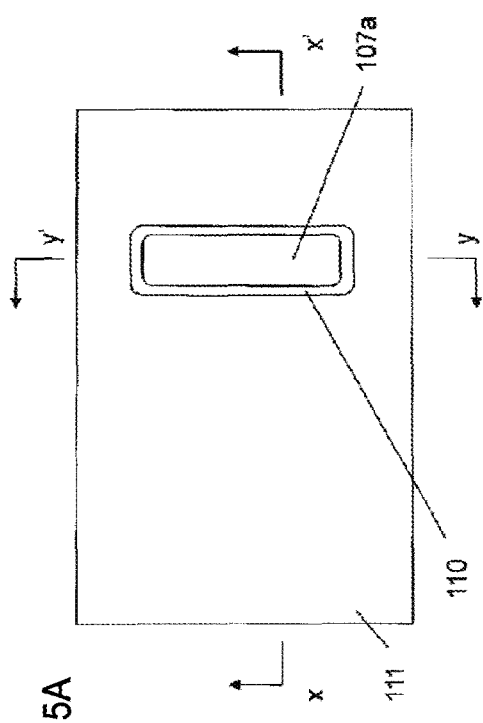
FIG. 15A is a plan view illustrating a method for producing a semiconductor device according to an embodiment of the present invention.
Figure 15B:
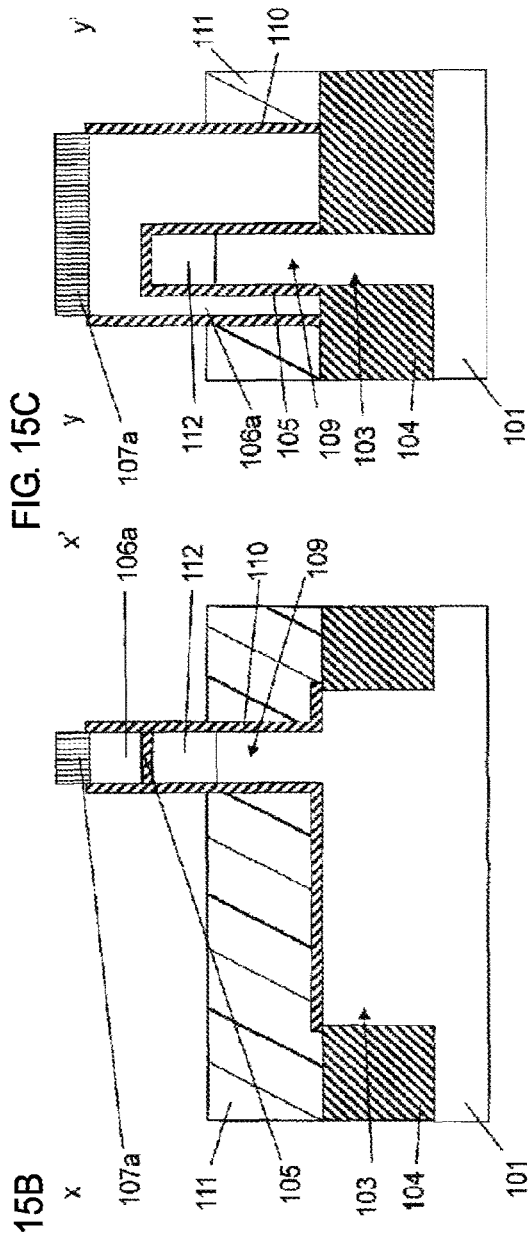
FIG. 15B is a sectional view taken along line X-X' in FIG. 15A.
Figure 15C:
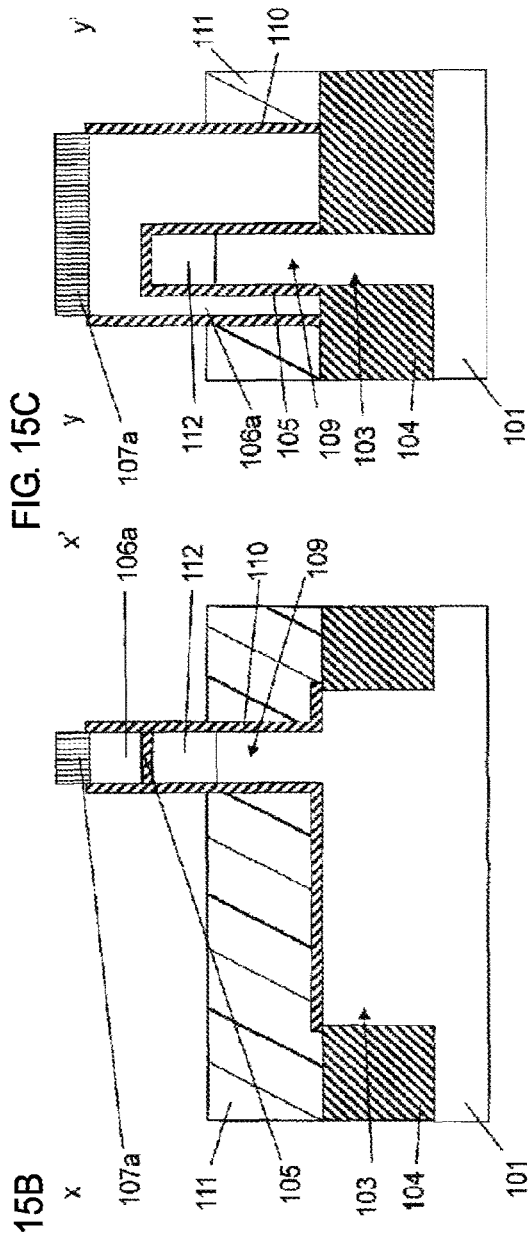
FIG. 15C is a sectional view taken along line Y-Y' in FIG. 15A.

As illustrated in FIGS. 14A, 14B, and 14C, a third resist 111 is formed and etched back to expose an upper portion of the pillar-shaped silicon layer 109. As illustrated in FIGS. 15A, 15B, and 15C, an impurity is introduced to form a first diffusion layer 112 in an upper portion of the pillar-shaped silicon layer 109. When an n-type diffusion layer is formed, arsenic or phosphorus is preferably introduced. When a p-type diffusion layer is formed, boron is preferably introduced.

As illustrated in FIGS. 16A, 16B, and 16C, the third resist 111 is removed. As illustrated in FIGS. 17A, 17B, and 17C, a second polysilicon 113 is deposited around the fourth insulating film 110 and planarized.

Figure 18A:
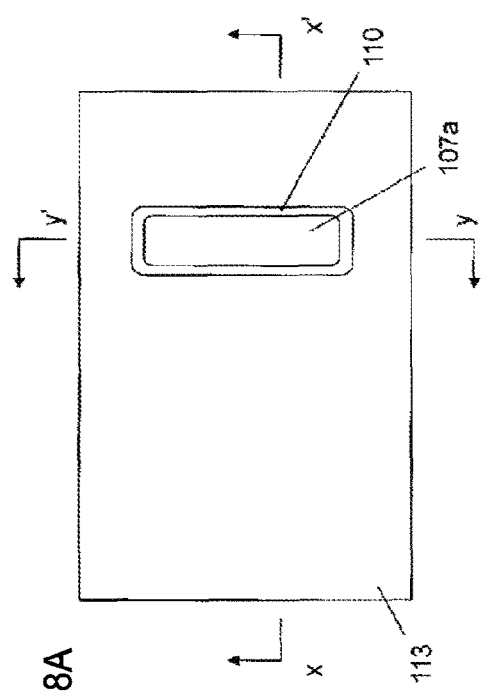
FIG. 18A is a plan view illustrating a method for producing a semiconductor device according to an embodiment of the present invention.
Figure 18C:
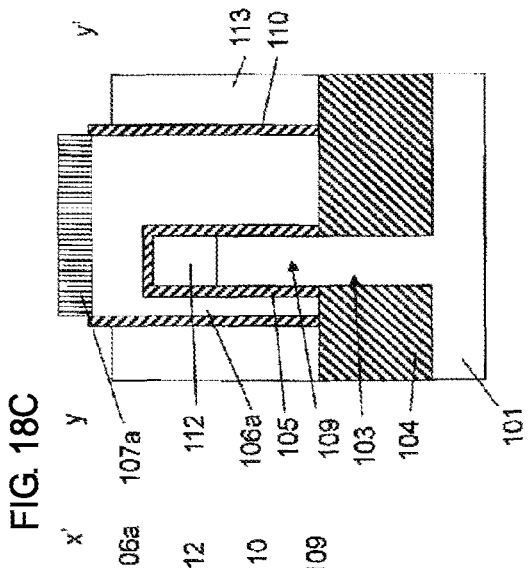
FIG. 18C is a sectional view taken along line Y-Y' in FIG. 18A.
Figure 18B:
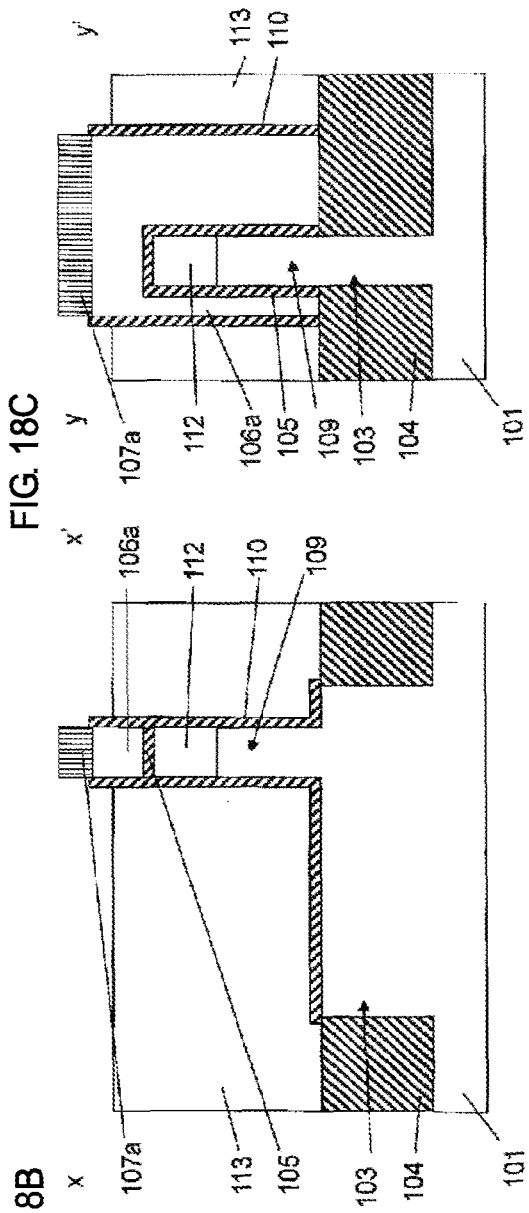
FIG. 18B is a sectional view taken along line X-X' in FIG. 18A.

As illustrated in FIGS. 18A, 18B, and 18C, the second polysilicon 113 is etched back to expose the first hard mask 107a.

As illustrated in FIGS. 19A, 19B, and 19C, a sixth insulating film 114 is deposited. The sixth insulating film 114 is preferably a nitride film.

As illustrated in FIGS. 20A, 20B, and 20C, a fourth resist 201 for forming a first dummy contact is formed.

Figure 21A:
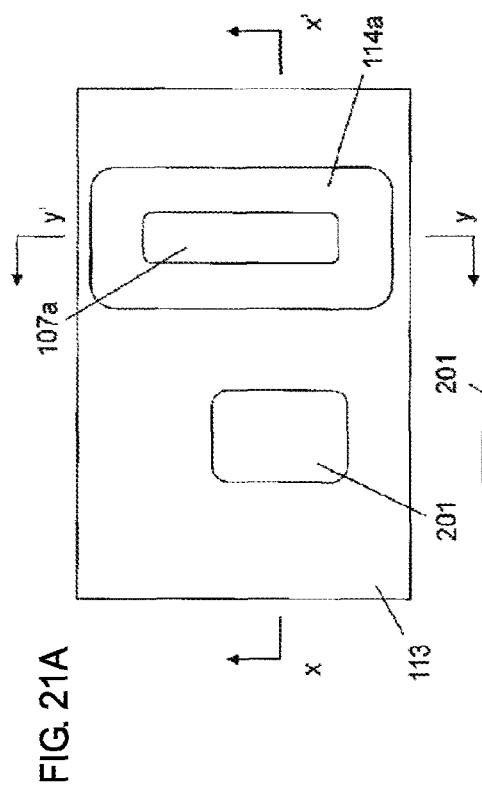
FIG. 21A is a plan view illustrating a method for producing a semiconductor device according to an embodiment of the present invention.
Figure 21C:
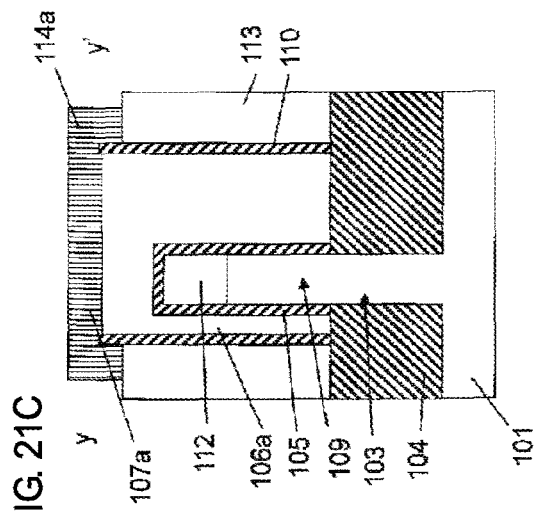
FIG. 21C is a sectional view taken along line Y-Y' in FIG. 21A.
Figure 21B:
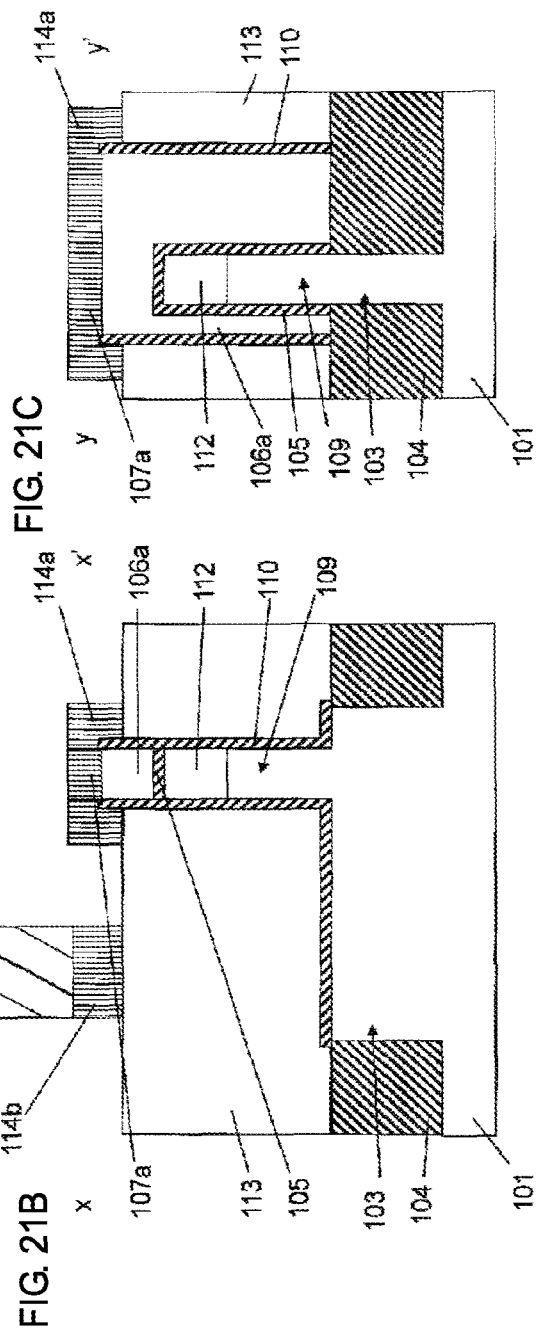
FIG. 21B is a sectional view taken along line X-X' in FIG. 21A.

As illustrated in FIGS. 21A, 21B, and 21C, the sixth insulating film 114 is etched. As a result, a second hard mask 114a is formed on a sidewall of the first hard mask 107a, and a third hard mask 114b for forming the first dummy contact on the fin-shaped silicon layer is formed.

Figure 22A:
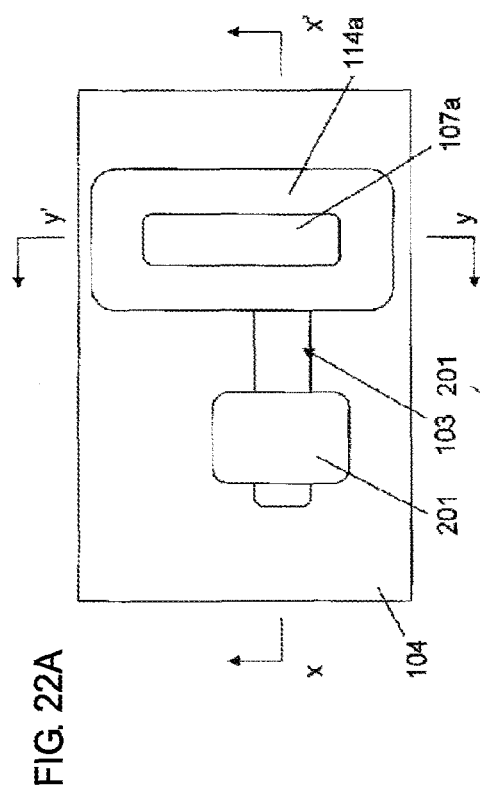
FIG. 22A is a plan view illustrating a method for producing a semiconductor device according to an embodiment of the present invention.
Figure 22C:
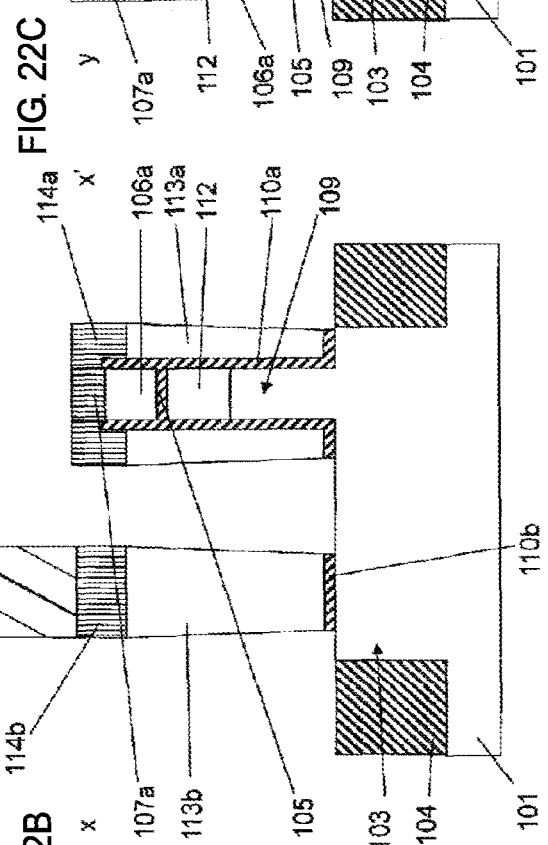
FIG. 22C is a sectional view taken along line Y-Y' in FIG. 22A.
Figure 22B:
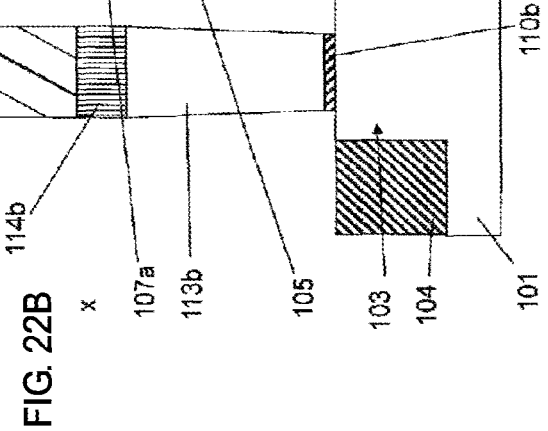
FIG. 22B is a sectional view taken along line X-X' in FIG. 22A.

As illustrated in FIGS. 22A, 22B, and 22C, the second polysilicon 113 is etched so that the second polysilicon 113 is left on sidewalls of the first dummy gate 106a and the pillar-shaped semiconductor layer 109 to form a second dummy gate 113a and form a first dummy contact 113b on the fin-shaped silicon layer 103. The fourth insulating film 110 is divided into fourth insulating films 110a and 110b. When the second polysilicon 113 is etched, by employing reverse-taper etching, the area of an upper surface of the second dummy gate 113a can be made larger than that of a lower surface of the second dummy gate 113a. Thus, in filling with a metal for forming a gate, the formation of holes can be prevented. At the same time, the area of an upper surface of the first dummy contact 113b can be made larger than that of a lower surface of the first dummy contact 113b. Thus, in filling with a metal for a first contact, the formation of holes can be prevented.

As illustrated in FIGS. 23A, 23B, to and 23C, the fourth resist 201 is removed.

The description so far has shown a third step that follows the second step and includes forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

Described next is a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

Figure 24C:
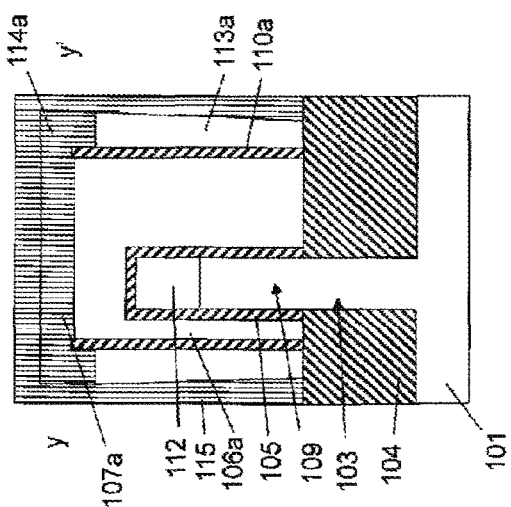
FIG. 24C is a sectional view taken along line Y-Y' in FIG. 24A.
Figure 24A:
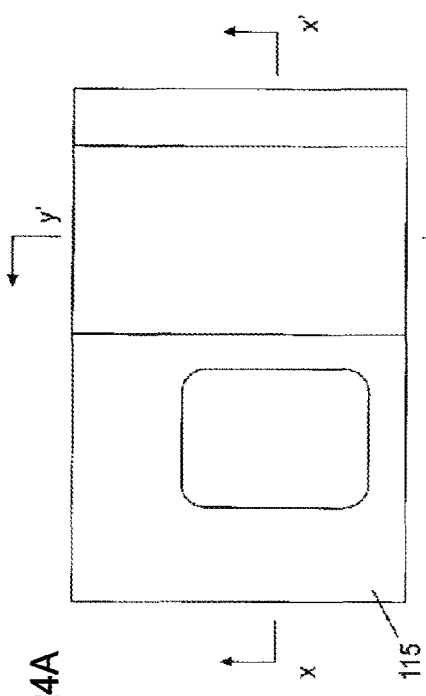
FIG. 24A is a plan view illustrating a method for producing a semiconductor device according to an embodiment of the present invention.
Figure 24B:
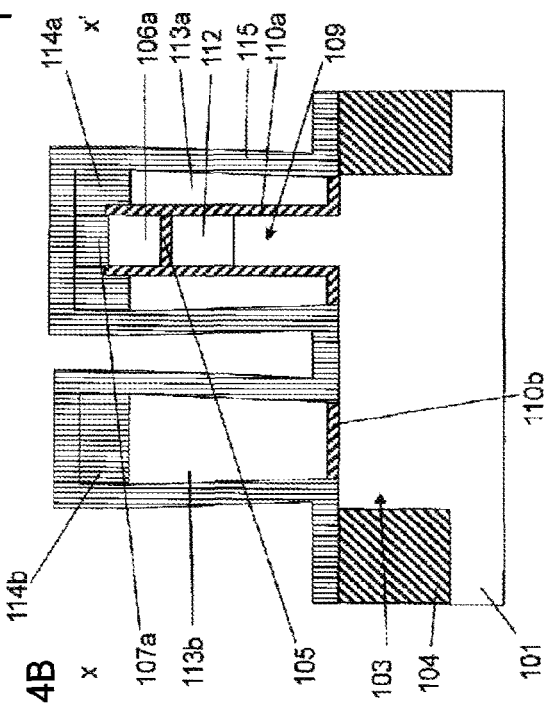
FIG. 24B is a sectional view taken along line X-X' in FIG. 24A.

As illustrated in FIGS. 24A, 24B, and 24C, a fifth insulating film 115 is formed around the second dummy gate 113a and the first dummy contact 113b. The fifth insulating film 115 is preferably a nitride film.

Figure 25A:
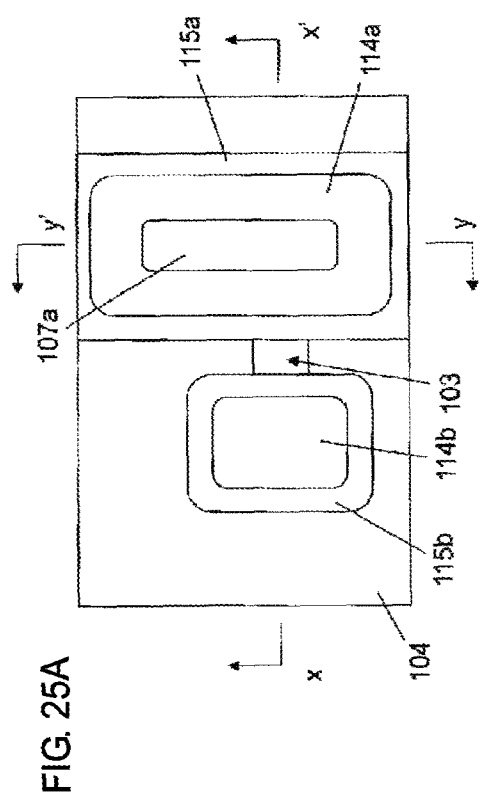
FIG. 25A is a plan view illustrating a method for producing a semiconductor device according to an embodiment of the present invention.
Figure 25C:
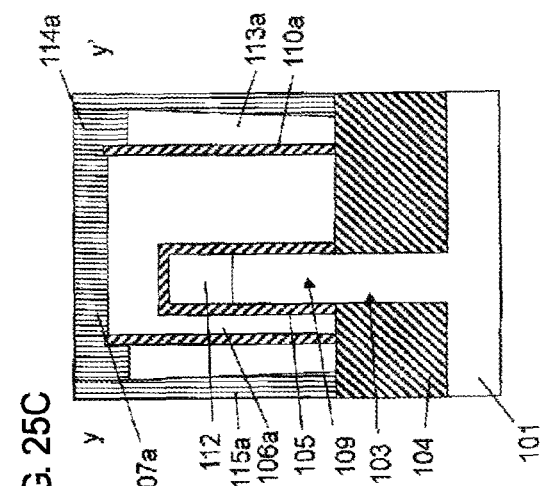
FIG. 25C is a sectional view taken along line Y-Y' in FIG. 25A.
Figure 25B:
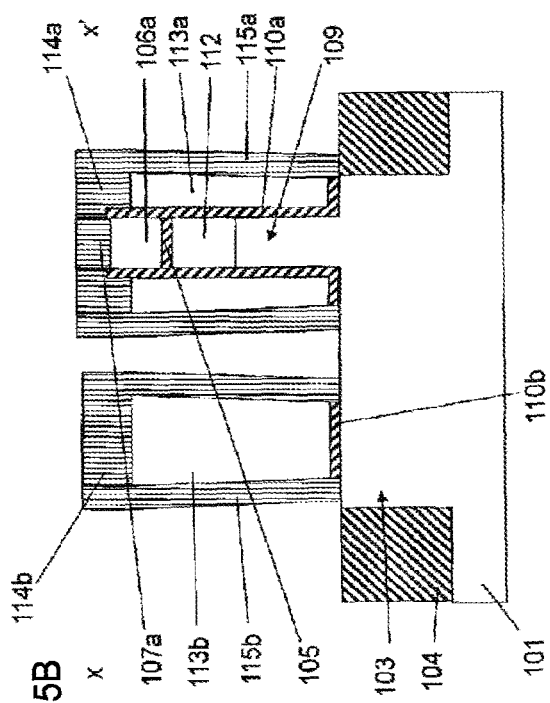
FIG. 25B is a sectional view taken along line X-X' in FIG. 25A.

As illustrated in FIGS. 25A, 25B, and 25C, the fifth insulating film 115 is etched into a sidewall shape so that sidewalls 115a and 115b formed of the fifth insulating film are formed.

As illustrated in FIGS. 26A, 26B, and 26C, an impurity is introduced to form a second diffusion layer 116 in an upper portion of the fin-shaped silicon layer 103 and a lower portion of the pillar-shaped silicon layer 109. When an n-type diffusion layer is formed, arsenic or phosphorus is preferably introduced. When a p-type diffusion layer is formed, boron is preferably introduced. Such an impurity may be introduced before the deposition of the fifth insulating film 115.

Figure 27A:
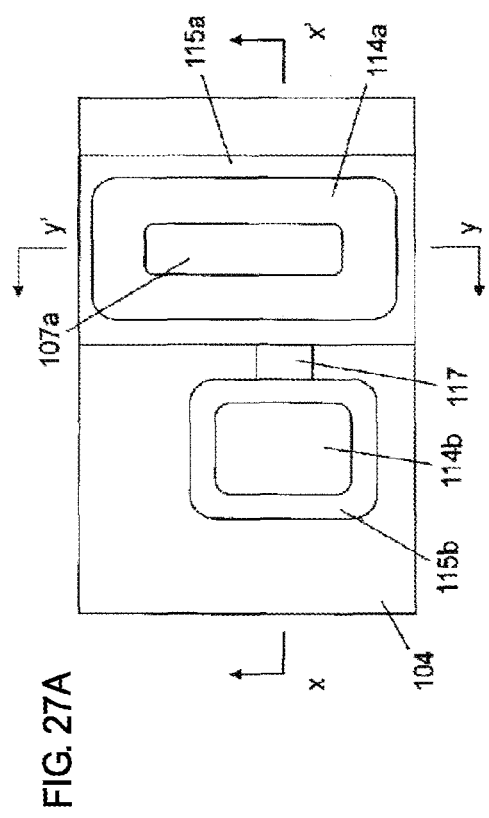
FIG. 27A is a plan view illustrating a method for producing a semiconductor device according to an embodiment of the present invention.
Figure 27C:
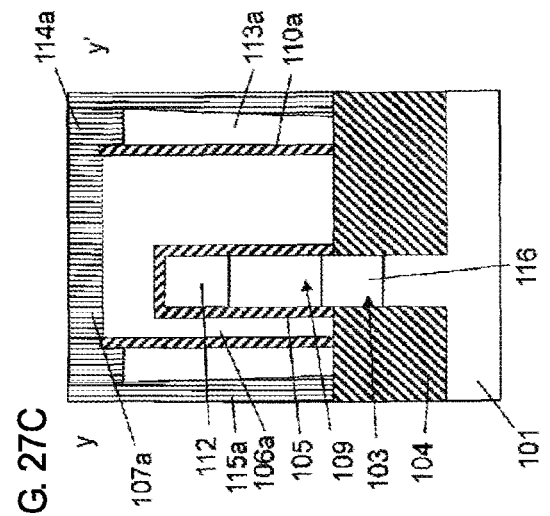
FIG. 27C is a sectional view taken along line Y-Y' in FIG. 27A.
Figure 27B:
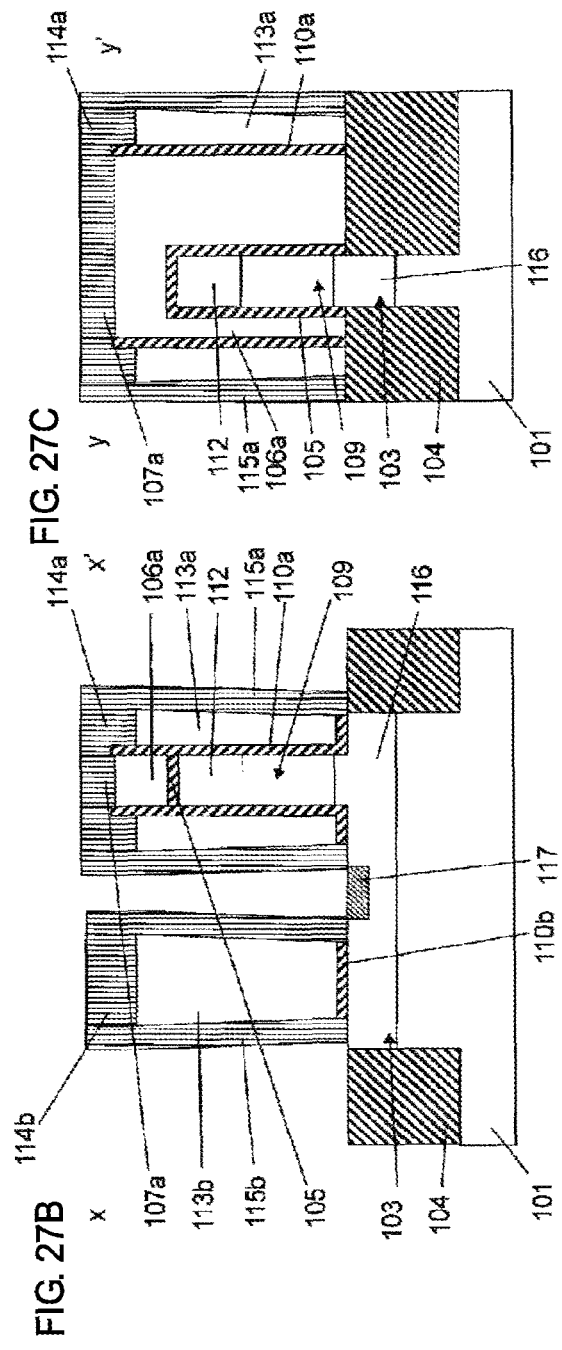
FIG. 27B is a sectional view taken along line X-X' in FIG. 27A.

As illustrated in FIGS. 27A, 27B, and 27C, a metal-semiconductor compound 117 is formed in an upper portion of the second diffusion layer 116. Herein, the first and second hard masks 107a and 114a prevent the formation of the metal-semiconductor compound in upper portions of the first and second dummy gates 106a and 113a. As a result, the metal-semiconductor compound can be formed only in an upper portion of the fin-shaped semiconductor layer 103.

The description so far has shown a fourth step that includes forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

Described next is a fifth step that follows the fourth step and includes depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

Figure 28A:
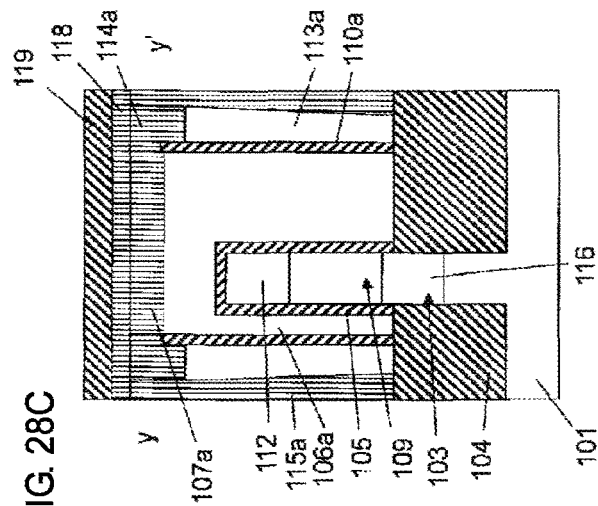
FIG. 28A is a plan view illustrating a method for producing a semiconductor device according to an embodiment of the present invention.
Figure 28B:
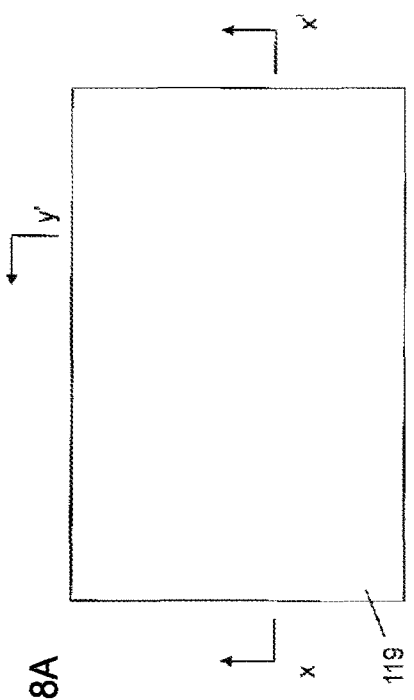
FIG. 28B is a sectional view taken along line X-X' in FIG. 28A.
Figure 28C:
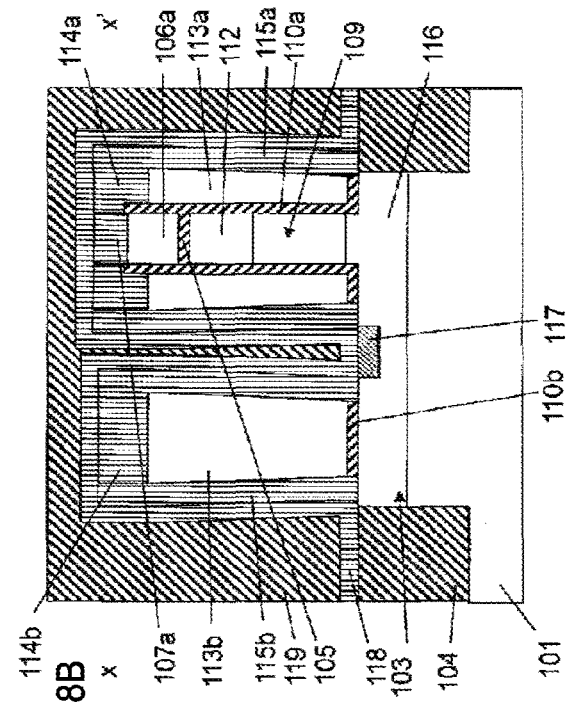
FIG. 28C is a sectional view taken along line Y-Y' in FIG. 28A.

As illustrated in FIGS. 28A, 28B, and 28C, a contact stopper film 118 is deposited, and an interlayer insulating film 119 is deposited. The contact stopper film 118 is preferably a nitride film. The contact stopper film 118 is not necessarily deposited.

As illustrated in FIGS. 29A, 29B, and 29C, chemical mechanical polishing is performed to expose upper portions of the second dummy gate 113a, the first dummy gate 106a, and the first dummy contact 113b.

As illustrated in FIGS. 30A, 30B, and 30C, the second dummy gate 113a, the first dummy gate 106a, and the first dummy contact 113b are removed.

Figure 31A:
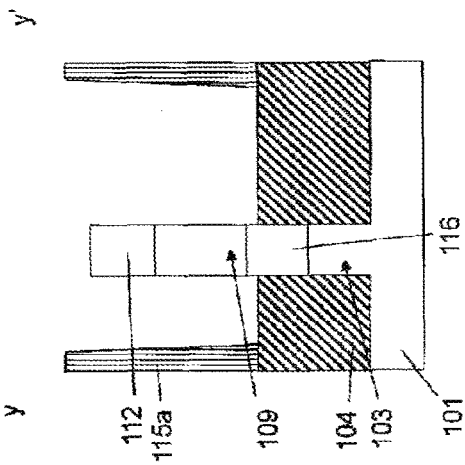
FIG. 31A is a plan view illustrating a method for producing a semiconductor device according to an embodiment of the present invention.
Figure 31B:
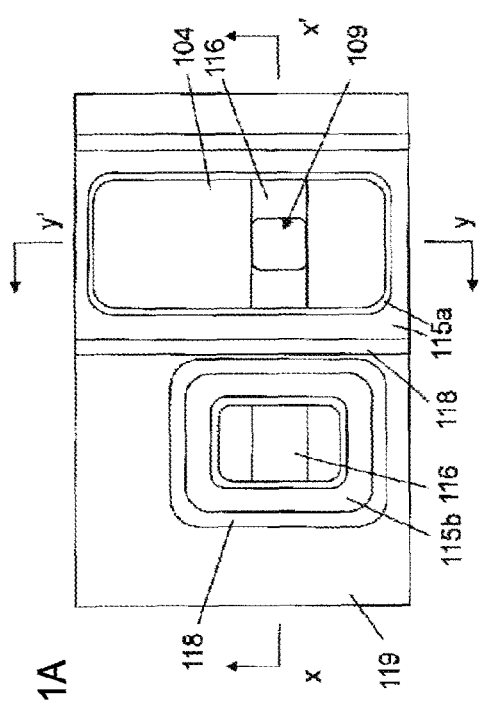
FIG. 31B is a sectional view taken along line X-X' in FIG. 31A.
Figure 31C:
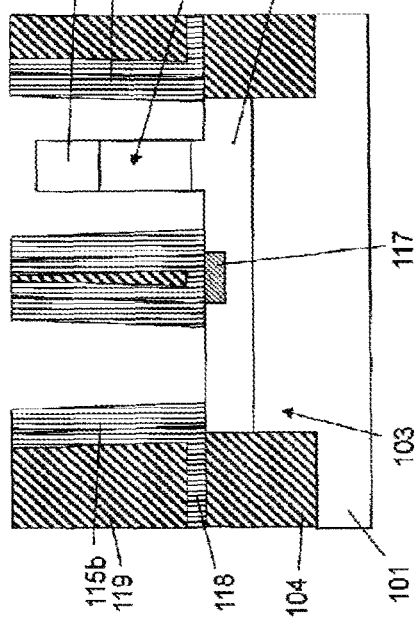
FIG. 31C is a sectional view taken along line Y-Y' in FIG. 31A.

As illustrated in FIGS. 31A, 31B, and 31C, the second insulating film 105 and the fourth insulating films 110a and 110b are removed.

As illustrated in FIGS. 32A, 32B, and 32C, a gate insulating film 120 is formed around the pillar-shaped silicon layer 109 and on an inner surface of the fifth insulating film 115a in a region where the second dummy gate 113a and the first dummy gate 106a have been present and on an inner surface of the fifth insulating film 115b in a region where the first dummy contact 113b has been present. As illustrated in FIGS. 33A, 33b, and 33C, a fifth resist 202 for removing the gate insulating film 120 at the bottom portion of the region where the first dummy contact 113b has been present is formed.

As illustrated in FIGS. 34A, 34B, and 34C, the gate insulating film 120 at the bottom portion of the region where the first dummy contact 113b has been present is removed. The gate insulating film 120 is divided into gate insulating films 120a and 120b. When the gate insulating film 120 is removed by performing anisotropic etching, a gate insulating film 120b is left on an inner surface of the fifth insulating film 115b in the region where the first dummy contact 113b has been present. The gate insulating film 120 may be removed by performing isotropic etching. Therefore, etching may be performed by the thickness of the gate insulating film, and thus a step of forming a deep contact hole is not required.

Figure 35A:
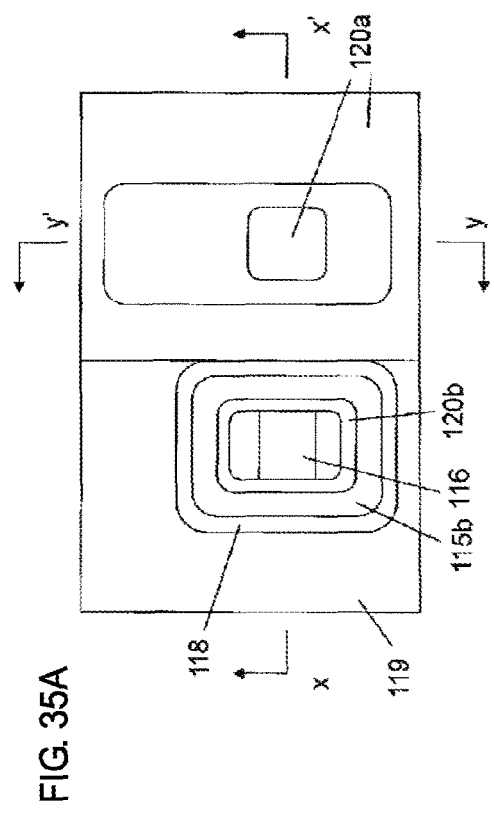
FIG. 35A is a plan view illustrating a method for producing a semiconductor device according to an embodiment of the present invention.
Figure 35C:
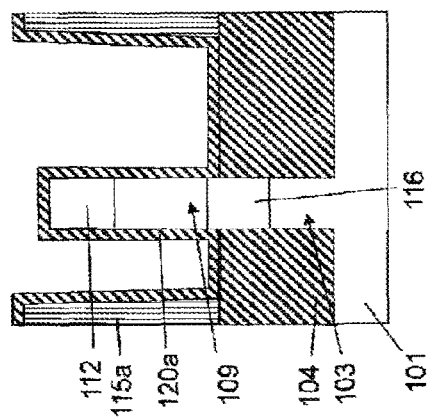
FIG. 35C is a sectional view taken along line Y-Y' in FIG. 35A.
Figure 35B:
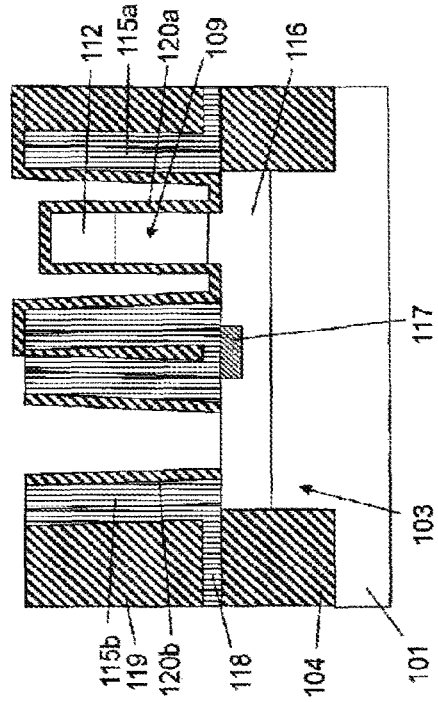
FIG. 35B is a sectional view taken along line X-X' in FIG. 35A.

As illustrated in FIGS. 35A, 35B, and 35C, the fifth resist 202 is removed. As illustrated in FIGS. 36A, 36B, and 36C, a metal 121 is deposited. As illustrated in FIGS. 37A, 37B, and 37C, the metal 121 is etched back to expose an upper portion of the pillar-shaped silicon layer 109. A gate electrode 121a is formed around the pillar-shaped silicon layer 109. A gate line 121b is also formed. A first contact 121c is also formed. The gate insulating films 120a and 120b formed around and at the bottom portions of the gate electrode 121 a and the gate line 121b can insulate the gate electrode 121a and the gate line 121b from the pillar-shaped silicon layer 109 and the fin-shaped silicon layer 103.

The description so far has shown a fifth step that follows the fourth step and includes depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

Figure 38A:
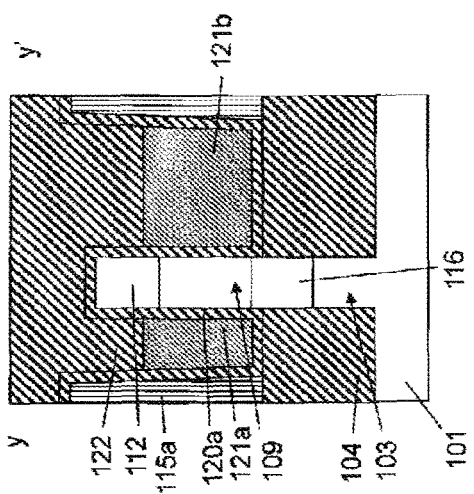
FIG. 38A is a plan view illustrating a method for producing a semiconductor device according to an embodiment of the present invention.
Figure 38B:
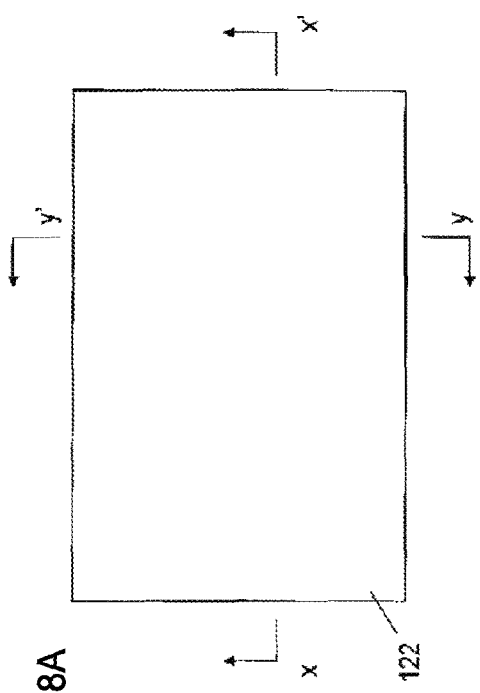
FIG. 38B is a sectional view taken along line X-X' in FIG. 38A.
Figure 38C:
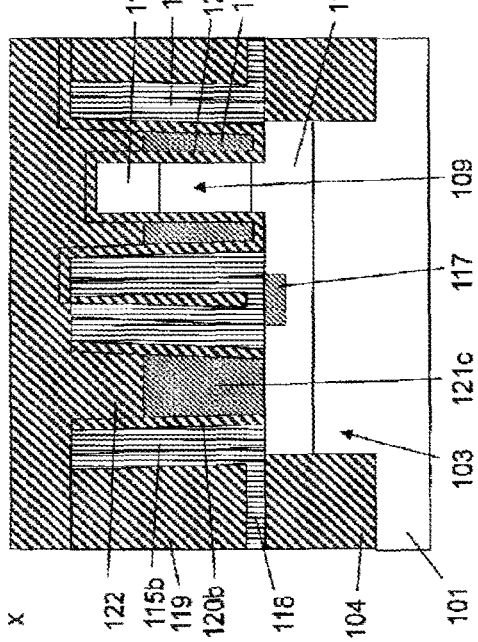
FIG. 38C is a sectional view taken along line Y-Y' in FIG. 38A.
Figure 40A:
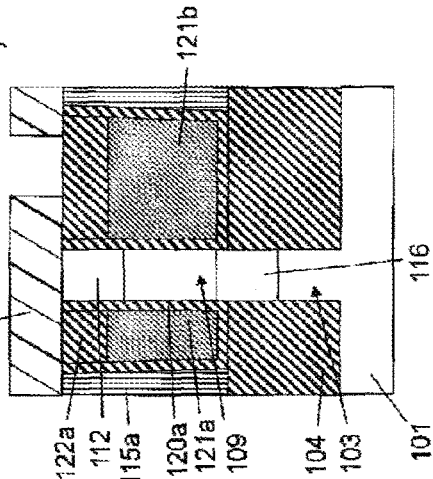
FIG. 40A is a plan view illustrating a method for producing a semiconductor device according to an embodiment of the present invention.
Figure 40B:
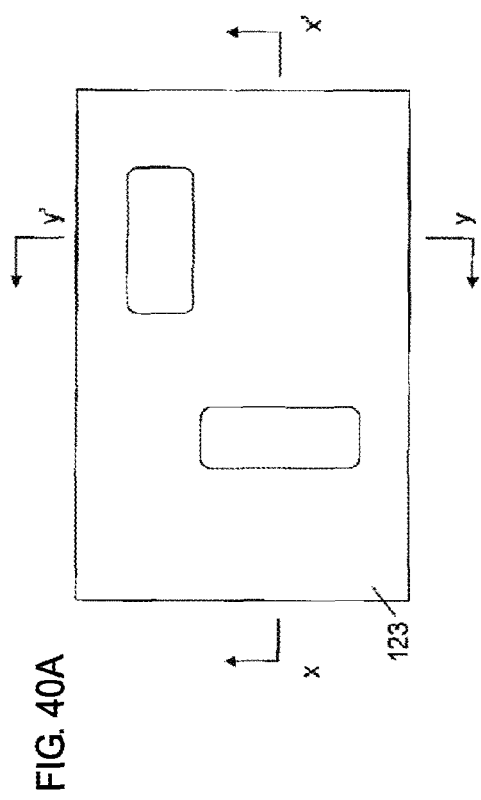
FIG. 40B is a sectional view taken along line X-X' in FIG. 40A.
Figure 40C:
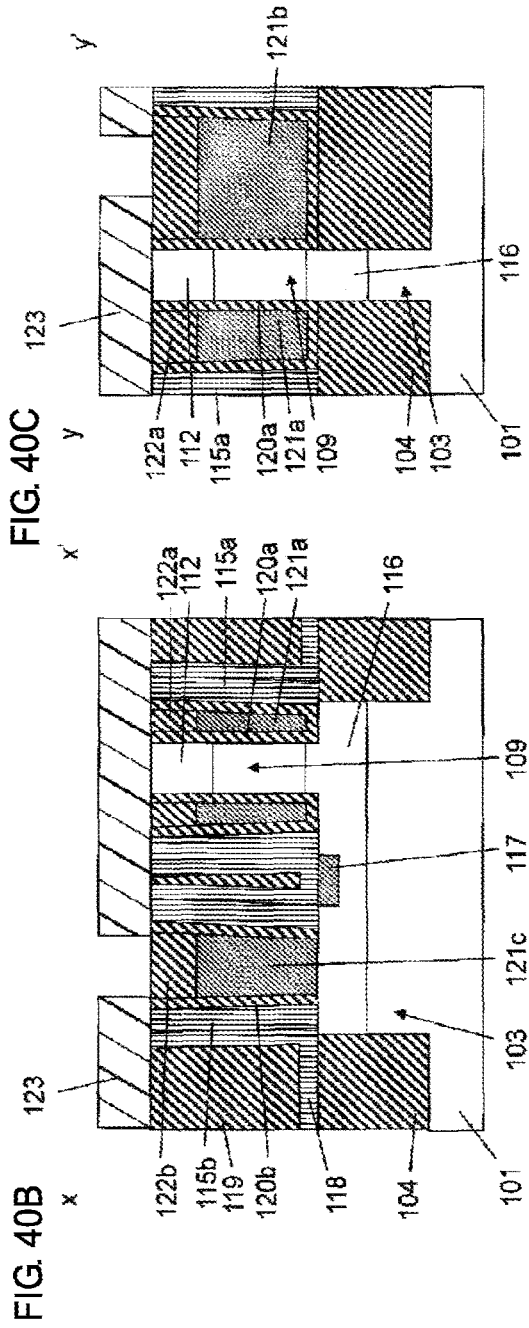
FIG. 40C is a sectional view taken along line Y-Y' in FIG. 40A.
Figure 41A:
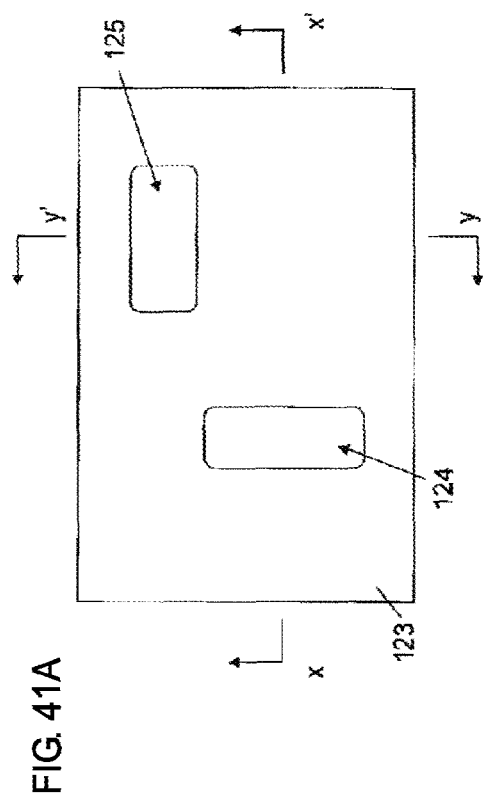
FIG. 41A is a plan view illustrating a method for producing a semiconductor device according to an embodiment of the present invention.
Figure 41C:
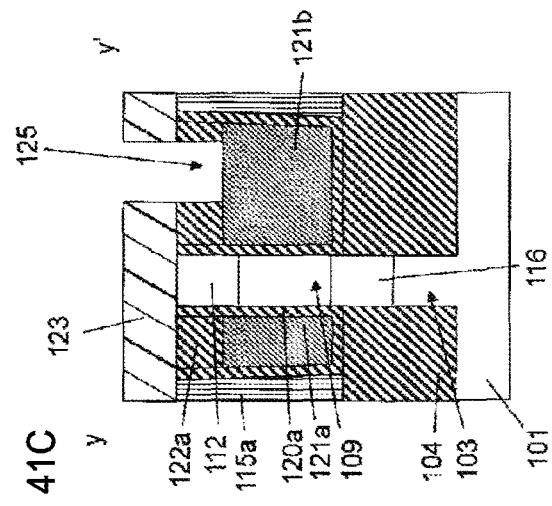
FIG. 41C is a sectional view taken along line Y-Y' in FIG. 41A.
Figure 41B:
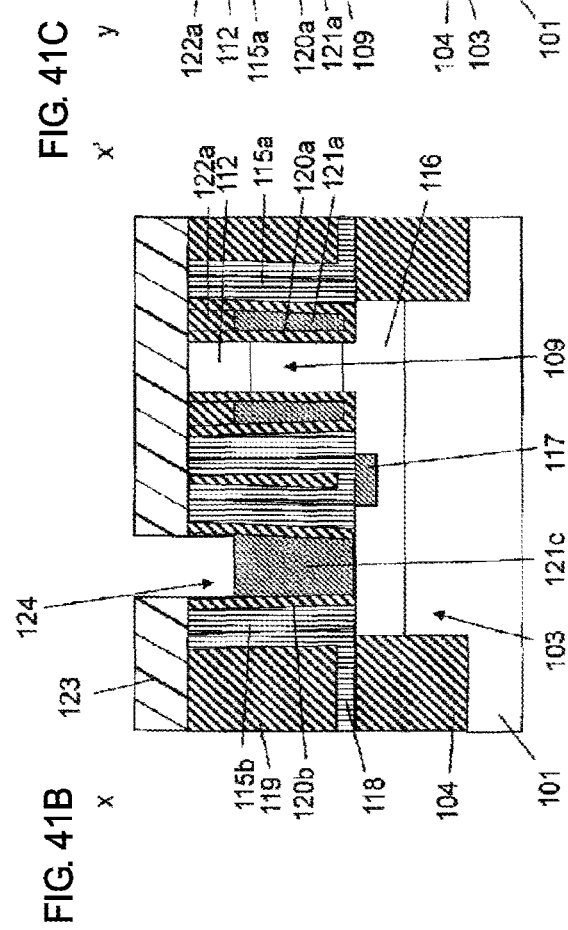
FIG. 41B is a sectional view taken along line X-X' in FIG. 41A.
Figure 43A:
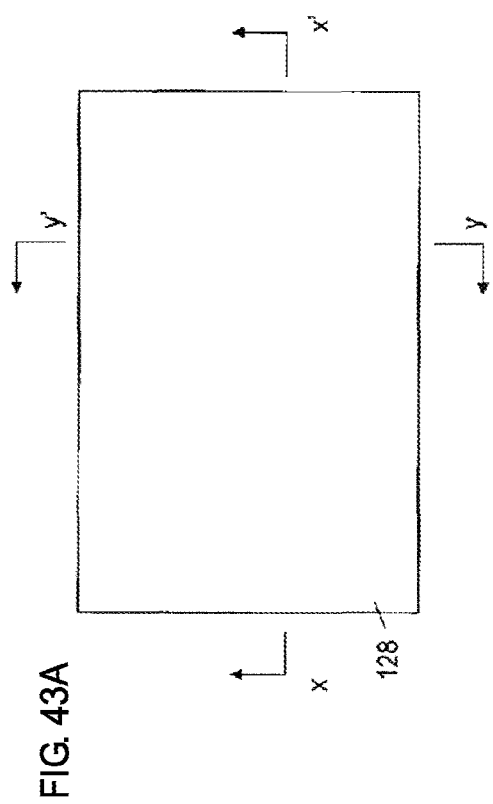
FIG. 43A is a plan view illustrating a method for producing a semiconductor device according to an embodiment of the present invention.
Figure 43C:
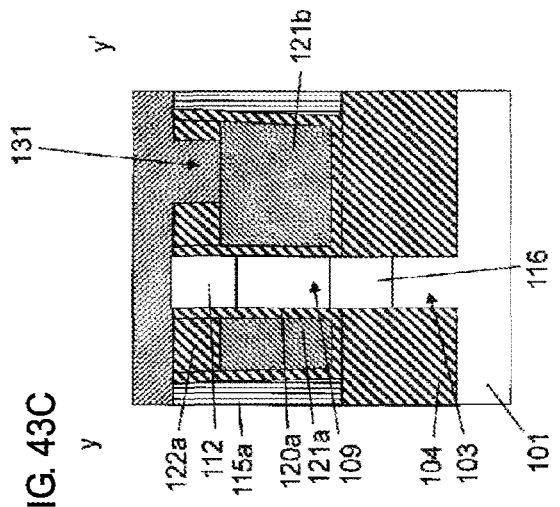
FIG. 43C is a sectional view taken along line Y-Y' in FIG. 43A.
Figure 43B:
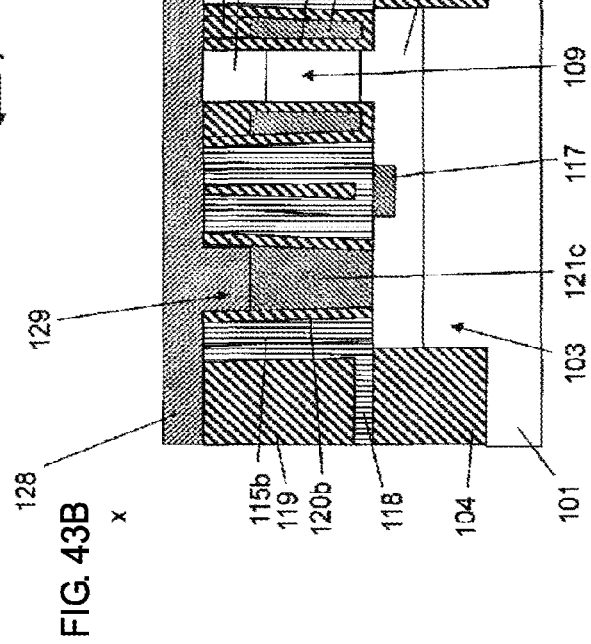
FIG. 43B is a sectional view taken along line X-X' in FIG. 43A.
Figure 46B:
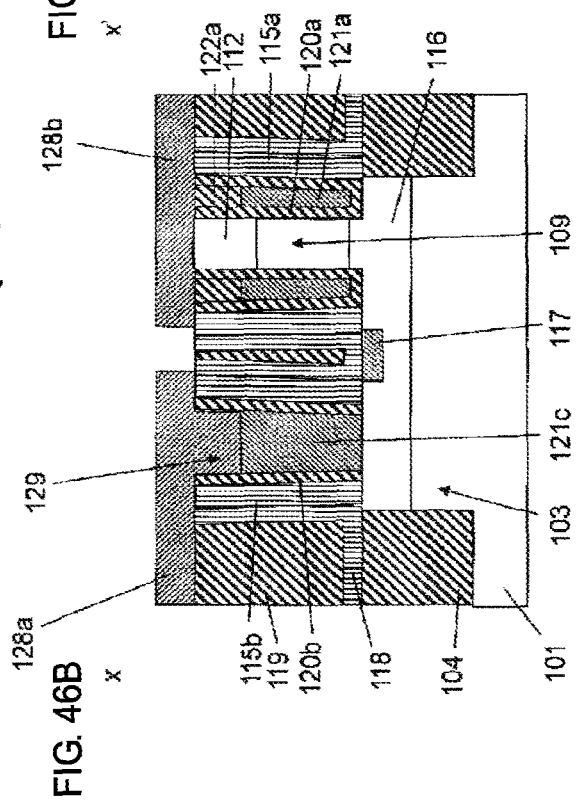
FIG. 46B is a sectional view taken along line X-X' in FIG. 46A.

As illustrated in FIGS. 38A, 38B, and 38C, a second interlayer insulating film 122 is deposited. As illustrated in FIGS. 39A, 39B, and 39C, the second interlayer insulating film 122 is planarized to expose the first diffusion layer 112 in an upper portion of the pillar-shaped silicon layer 109. The second interlayer insulating film 122 is divided into second interlayer insulating films 122a and 122b. As illustrated in FIGS. 40A, 40B, and 40C, a sixth resist 123 for forming contact holes is formed. As illustrated in FIGS. 41A, 41B, and 41C, the second interlayer insulating films 122a and 122b are etched to form contact holes 124 and 125. As illustrated in FIGS. 42A, 42B, and 42C, the sixth resist 123 is removed. As illustrated in FIGS. 43A, 43B, and 43C, a metal 128 is deposited to form second contacts 129 and 131. As illustrated in FIGS. 44A, 44B, and 44C, seventh resists 132, 133, and 134 for forming metal wires are formed. As illustrated in FIGS. 45A, 45B, and 45C, the metal 128 is etched to form metal wires 128a, 128b, and 128c. As illustrated in FIGS. 46A, 46B, and 46C, the seventh resists 132, 133, and 134 are removed. The description so far has shown a method for producing an SGT which employs a gate-last process and in which a fin-shaped semiconductor layer, a pillar-shaped semiconductor layer, a gate electrode, and a gate line are formed by self-alignment and a dummy gate and a dummy contact are simultaneously formed.

FIGS. 1A, 1B, and 1C illustrate a structure of the semiconductor device obtained by the above production method.

The semiconductor device includes a fin-shaped silicon layer 103 formed on a silicon substrate 101, a first insulating film 104 formed around the fin-shaped silicon layer 103, a first contact 121c formed on the fin-shaped silicon layer 103, and a gate insulating film 120b formed around the first contact 121c. Since the gate insulating film 120 at the bottom portion of a region where the first dummy contact 113b has been present has been removed, the gate insulating film 120b remains on an inner surface of the fifth insulating film 115b in the region where the first dummy contact 113b has been present. The gate insulating film 120 is a highly insulating film formed by atomic layer deposition, and thus can insulate the first contact 121c from the surrounding structure.

The semiconductor device also includes a pillar-shaped silicon layer 109 formed on the fin-shaped silicon layer 103, a gate insulating film 120a formed around the pillar-shaped silicon layer 109, a gate electrode 121a formed around the gate insulating film 120a and made of a metal, a gate line 121b connected to the gate electrode 121a, extending in a direction perpendicular to a direction in which the fin-shaped silicon layer 103 extends, and made of a metal, a first diffusion layer 112 formed in an upper portion of the pillar-shaped silicon layer 109, and a second diffusion layer 116 formed in an upper portion of the fin-shaped silicon layer 103 and a lower portion of the pillar-shaped silicon layer 109. The upper surface of the gate electrode 121a has a larger area than the lower surface of the gate electrode 121a. The upper surface of the gate line 121b has a larger area than the lower surface of the gate line 121b. Misalignment between the pillar-shaped silicon layer 109 and the gate line 121b can be eliminated because they are formed by self-alignment.

The gate insulating film 120 formed around and at the bottom portions of the gate electrode 121a and the gate line 121b can insulate the gate electrode 121a and the gate line 121b from the pillar-shaped silicon layer 109 and the fin-shaped silicon layer 103.

It should be noted that various other embodiments and modifications can be made without departing from the broad spirit and scope of the present invention, and the above-described embodiments are merely for illustrative purpose only and do not limit the scope of the present invention.

For example, in the above-described embodiments, a method for producing a semiconductor device in which the p-type (including the p-type) and the n-type (including the n+-type) are each changed to the opposite conductivity type and a semiconductor device produced by the method are naturally within the technical scope of the present invention.

The invention claimed is:

1. A method for producing a semiconductor device, the method comprising:
   a first step of
      forming a fin-shaped semiconductor layer on a semiconductor substrate and forming a first insulating film around the fin-shaped semiconductor layer;
   a second step, after the first step, of forming a second insulating film around the fin-shaped semiconductor layer,
   depositing a first polysilicon on the second insulating film, planarizing the first polysilicon,
   forming a third insulating film on the first polysilicon,
   forming a second resist for forming a gate line and a pillar-shaped semiconductor layer in a direction perpendicular to a direction in which the fin-shaped semiconductor layer extends, and
   etching the third insulating film, the first polysilicon, the second insulating film, and the fin-shaped semiconductor layer to form a pillar-shaped semiconductor layer, a first dummy gate formed of the first polysilicon, and a first hard mask formed of the third insulating film; and a third step, after the second step, of forming a fourth insulating film around the pillar-shaped semiconductor layer and the first dummy gate, depositing a second polysilicon around the fourth insulating film, planarizing the second polysilicon, etching back the second polysilicon to expose the first hard mask, depositing a sixth insulating film, forming a fourth resist for forming a first dummy contact, etching the sixth insulating film to form a second hard mask on a sidewall of the first hard mask and to form a third hard mask for forming the first dummy contact on the fin-shaped semiconductor layer, etching the second polysilicon so that the second polysilicon is left on sidewalls of the first dummy gate and the pillar-shaped semiconductor layer to form a second dummy gate, and forming the first dummy contact on the fin-shaped semiconductor layer.

2. The method according to claim 1, wherein an upper surface of the second dummy gate has a larger area than a lower surface of the second dummy gate.

3. The method according to claim 1, further comprising, after the fourth insulating film is formed around the pillar-shaped semiconductor layer and the first dummy gate, forming a third resist, etching back the third resist to expose an upper portion of the pillar-shaped semiconductor layer, and forming a first diffusion layer in the upper portion of the pillar-shaped semiconductor layer.

4. The method according to claim 1, further comprising a fourth step of forming a fifth insulating film around the second dummy gate and the first dummy contact, etching the fifth insulating film into a sidewall shape so that sidewalls formed of the fifth insulating film are formed, forming a second diffusion layer in an upper portion of the fin-shaped semiconductor layer and a lower portion of the pillar-shaped semiconductor layer, and forming a metal-semiconductor compound in an upper portion of the second diffusion layer.

5. The method according to claim 4, further comprising a fifth step, after the fourth step, of depositing a contact stopper film, depositing an interlayer insulating film, performing chemical mechanical polishing to expose upper portions of the second dummy gate, the first dummy gate, and the first dummy contact, removing the second dummy gate, the first dummy gate, and the first dummy contact, removing the second insulating film and the fourth insulating film, forming a gate insulating film around the pillar-shaped semiconductor layer and on an inner surface of the fifth insulating film in a region where the second dummy gate and the first dummy gate have been present and on an inner surface of the fifth insulating film in a region where the first dummy contact has been present, forming a fifth resist for removing the gate insulating film at a bottom portion of the region where the first dummy contact has been present, removing the gate insulating film at a bottom portion of the region where the first dummy contact has been present, depositing a metal, and etching back the metal to form a gate electrode, a gate line, and a first contact.

* * * * *